US012227827B2

(12) United States Patent
Ready et al.

(10) Patent No.: US 12,227,827 B2
(45) Date of Patent: Feb. 18, 2025

(54) METHODS TO IMPART COLOR AND DURABLE PROPERTIES TO SUBSTRATES

(71) Applicant: Georgia Tech Research Corporation, Atlanta, GA (US)

(72) Inventors: William Judson Ready, Atlanta, GA (US); Jason Hayes Nadler, Decatur, GA (US); Stephan Turano, Atlanta, GA (US); Brent Karl Wagner, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 564 days.

(21) Appl. No.: 16/204,625

(22) Filed: Nov. 29, 2018

(65) Prior Publication Data

US 2019/0161847 A1 May 30, 2019

Related U.S. Application Data

(60) Provisional application No. 62/591,866, filed on Nov. 29, 2017.

(51) Int. Cl.
*C23C 14/34* (2006.01)
*C23C 14/00* (2006.01)
(Continued)

(52) U.S. Cl.
CPC .......... *C23C 14/0015* (2013.01); *C23C 14/02* (2013.01); *C23C 14/042* (2013.01);
(Continued)

(58) Field of Classification Search
CPC ... C23C 14/0015; C23C 14/02; C23C 14/042; C23C 14/0641; C23C 14/3471;
(Continued)

(56) References Cited

U.S. PATENT DOCUMENTS

| 5,700,551 A | * | 12/1997 | Kukino | ............... C04B 35/5831 427/419.1 |
| 2013/0130107 A1 | * | 5/2013 | Uchida | ................. H01M 4/626 429/211 |
| 2016/0040912 A1 | * | 2/2016 | Chandra | ............. C23C 14/0676 428/216 |

OTHER PUBLICATIONS

Jalali et al. "The effect of Al content, substrate temperature and nitrogen flow rate on optical band gap and optical features of nanostructured TiAlN thin films prepared by reactive magnetron sputtering," Appl. Phys. A (Published online: Oct. 24, 2016) 122: 978, pp. 1-7. (Year: 2016).*

(Continued)

*Primary Examiner* — Rodney G McDonald
(74) *Attorney, Agent, or Firm* — Meunier Carlin & Curfman LLC

(57) ABSTRACT

Metal substrates comprising a colored coating and/or a protective coating disposed on at least a surface of the substrate. The colored coating can include a metal oxide coating integrally bonded to the terminal and produced by heat tinting or a titanium nitride containing material. The protective coating is derived from a material comprising one or more of aluminum oxide, silicon oxide, a superhydrophobic material, wherein the protective coating has a Scratch Resistance of at least about F, as determined by ASTM D336. Methods of making and using the coated metal substrates are also disclosed.

24 Claims, 14 Drawing Sheets
(14 of 14 Drawing Sheet(s) Filed in Color)

(51) Int. Cl.
  *C23C 14/02*    (2006.01)
  *C23C 14/04*    (2006.01)
  *C23C 14/06*    (2006.01)
  *H01M 50/109*   (2021.01)
  *H01M 50/545*   (2021.01)
  *H01M 50/562*   (2021.01)

(52) U.S. Cl.
  CPC ...... *C23C 14/0641* (2013.01); *C23C 14/3471* (2013.01); *H01M 50/109* (2021.01); *H01M 50/545* (2021.01); *H01M 50/562* (2021.01)

(58) Field of Classification Search
  CPC .. H01M 2/0222; H01M 2/0267; H01M 2/027; H01M 2/0285
  USPC ........................................ 204/192.26–192.28
  See application file for complete search history.

(56) References Cited

OTHER PUBLICATIONS

Zhou et al. "Phase transition and properties of Ti—Al—N thin films prepared by r.f.-plasma assisted magnetron sputtering", Thin Solid Films, 339, (1999), 203-208. (Year: 1999).*

Zhu et al. "Chromaticity and optical properties of colored and black solar-thermal absorbing coatings", Solar Energy Materials & Solar Cells 94 (2010) p. 1630-1635. (Year: 2010).*

\* cited by examiner

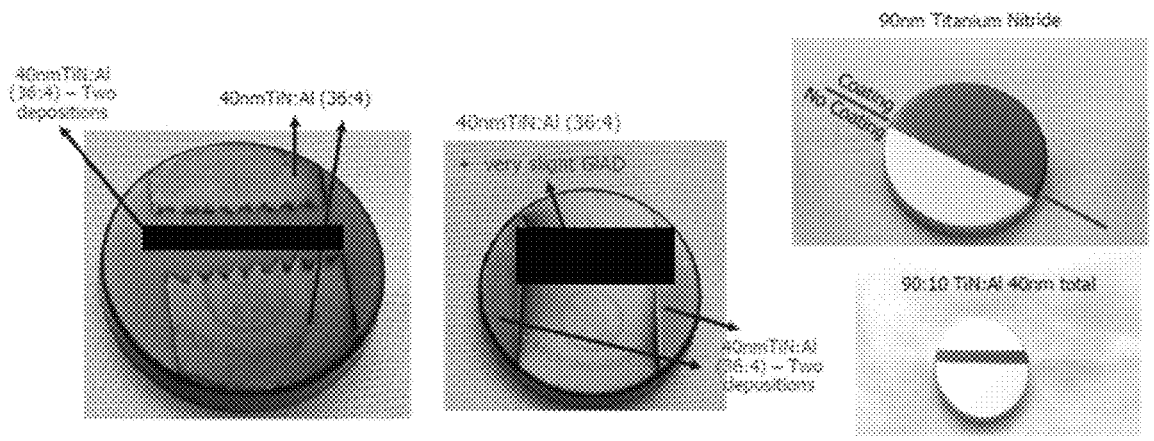
*Figure 6*
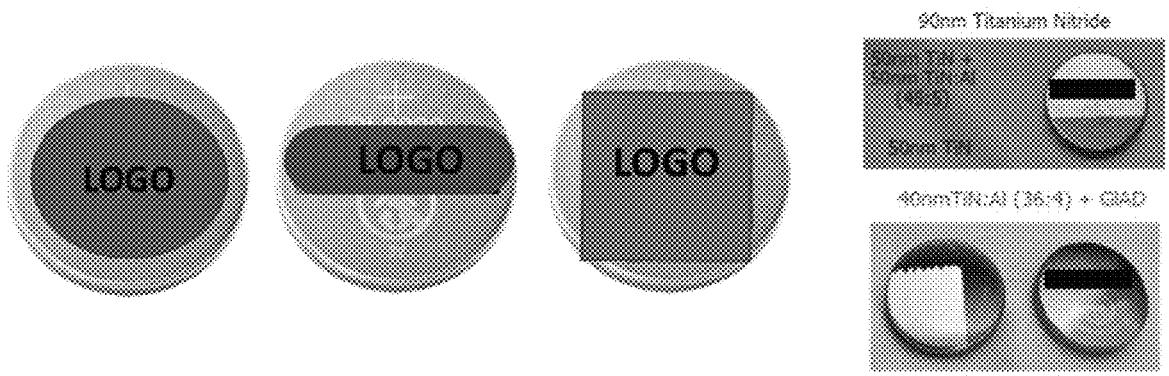
*Figure 7*
| Temperature | Baseline | 380°C | 380°C | 390°C | 400°C | 400°C |
|---|---|---|---|---|---|---|
| Air Flow | None | None | 1L/min | 1L/min | 1L/min | 1L/min |
| Time Duration | None | 1 hour | 1 hour | 1 hour | 1 hour | 2 hours |
| Pretreatment | Yes | No | No | No | No | No |
| Image | | | | | | |
*Figure 8*

| Temperature | Baseline | 420°C | 420°C | 420°C | 440°C | 440°C |
|---|---|---|---|---|---|---|
| Air Flow | None | None | 1L/min | 1L/min | 1L/min | 1L/min |
| Time Duration | None | 1 hour | 1 hour | 2 hour | 1 hour | 2 hours |
| Pretreatment | Yes | No | Yes | Yes | Yes | Yes |
| Image | | | | | | |

*Figure 9*

| Temperature | 350°C | 350°C | 350°C | 400°C | 440°C | 440°C |
|---|---|---|---|---|---|---|
| Air Flow | 250 sccm $O_2$ 250 sccm Ar | 250 sccm $O_2$ 250 sccm Ar | 250 sccm $O_2$ 250 sccm Ar | 250 sccm $O_2$ 250 sccm Ar | 250 sccm $O_2$ 250 sccm Ar | 250 sccm $O_2$ 250 sccm Ar |
| Time Duration | 1 hour | 1 hour | 1 hour | 1 hour | 1 hour | 1 hour |
| Pretreatment | Yes | Yes | Yes | Yes | Yes | Yes |
| Image | | | | | | |

*Figure 10*

| Temperature | Baseline | 65°C | 65°C | 75°C | 75°C | 85°C |
|---|---|---|---|---|---|---|
| Time Duration | None | 1 minute | 5 minutes | 5 minutes | 10 minutes | 5 minutes |
| Pretreatment | Yes | No | Yes | Yes | Yes | Yes |
| Image | | | | | | |

*Figure 11*

METHODS TO IMPART COLOR AND DURABLE PROPERTIES TO SUBSTRATES

CROSS-REFERENCE TO RELATED APPLICATIONS

This application claims the benefit of U.S. Provisional Application No. 62/591,866, filed Nov. 29, 2017, which is hereby incorporated herein by reference in its entirety.

BACKGROUND

Color differentiation is a key attribute for many commercial products. Stainless steels, for example, are conventionally provided with highly attractive metallic finishes that are ideal for architectural and decorative applications. Such applications include outdoor and indoor building panels, as well as automobile trim and appliance applications and, consequently, the surface requirements vary broadly and range from the substantially non-reflective finishes commonly employed for outdoor building panel applications, to the bright finishes usually employed as indoor building panel trim or for automotive and appliance trim. Other common finishes for architectural applications include special non-reflective building panel finishes provided by grit or shot blasting cold rolling rolls and embossing such finishes on sheet or strip during cold rolling.

Fabricators and users of stainless steel and other metal substrates have long desired and sought attractive colored metal articles that would exhibit the attractive metal finishes such as those enumerated above, but would simultaneously exhibit color other than the natural silver luster of the metal as well as critical properties including electrical conductivity, resistivity, corrosion resistance, adhesion, hardness, mechanical integrity, durability, cost and commercial viability. Colored metal substrates, particularly those that retain an attractive metallic finish are in great demand. Presently available color coats or paints that may be employed on metal substrate surfaces degrades electrical conductivity and impacts other metal properties.

There is a need for metal substrates that can be differentiated by color and simultaneously exhibit critical assessment variables including electrical conductivity, resistivity, corrosion resistance, adhesion, hardness, mechanical integrity, durability, cost and commercial viability. The compositions and methods described herein address these and other needs.

SUMMARY

In accordance with the purposes of the disclosed compositions and methods, as embodied and broadly described herein, the disclosed subject matter relates to coated substrates and methods of making and use thereof. The substrate can be a metal substrate including for example, nickel, stainless steel, aluminum, or combinations thereof, or glass. In specific examples, the metal substrate can be a battery terminal, an architectural component, or an aerospace structural component. The battery terminal can be present on a coin cell battery.

In embodiments where the coating is a colored coating, methods of making the coated substrate can include depositing an electrically conductive colored coating onto a surface of the substrate to a thickness from about 10 nm to about 100 nm, wherein the electrically conductive colored coating reflects light within a wavelength range from 400 nm to 700 nm. Depositing the electrically conductive colored coating can be by radio frequency sputtering at a vacuum pressure of from about 1 mTorr to about 25 mTorr, with a power from about 150 W to about 500 W, and using an inert gas having a flow rate of from about 5 standard cubic centimeters per minute (sccm) to about 50 sccm as a sputtering gas at a sputtering temperature of from about 25° C. to about 60° C. In some examples, radio frequency sputtering can be conducted at a vacuum pressure of from about 5 mTorr to about 10 mTorr, with a power from about 200 W to about 300 W, and using an inert gas having a flow rate of from about 10 sccm to about 15 sccm as the sputtering gas at a sputtering temperature of from about 25° C. to about 40° C., for about 0.1 min to about 10 mins.

The electrically conductive colored coating can comprise a transition metal nitride such as titanium nitride. The electrically conductive colored coating can further comprise an alloying element selected from at least one of aluminum, cobalt, manganese, vanadium, chromium, niobium, nickel, molybdenum, and copper, preferably aluminum. The titanium nitride and the alloying element can be present in a weight ratio of from 1:1 to 99:1 such as from 2:1 to 25:1.

Logos can be printed on a surface of the substrate by positioning a mask having a predetermined pattern to conceal at least a portion of the metal substrate prior to depositing the electrically conductive colored coating and removing the mask after depositing the electrically conductive colored coating.

In other embodiments where the coating is a colored coating, methods of making the coated substrate can include heat treating the metal substrate in an oxidizing atmosphere selected from a temperature from 250° C. to less than 500° C. in the presence of a gas comprising dry air, oxygen, argon, nitrogen, water vapor, or a combination thereof and having a flow rate of 250 sccm or greater, or a temperature of from 65° C. to less than 100° C. in the presence of an oxidizing acid comprising chromic acid solution, wherein the metal substrate is heated for a period of time from 1 minute to 2 hours to form an electrically conductive colored oxide coating that reflects light within a wavelength range from 10 nm to 100 nm and is integrally bonded to the surface of the metal substrate. In some examples, the metal substrate is heat treated to a temperature from 300° C. to less than 450° C. in the presence of air, oxygen, argon, or a mixture thereof, having a flow rate of from 250-1000 sccm for a period of time from 0.1 minute to 2 hours. In other embodiments, the metal substrate is pre-treating with ammonium hydroxide followed by phosphoric acid to form a pre-treated substrate and then the pre-treated substrate is heat treating to a temperature from 75° C. to less than 85° C. in the presence of chromic acid solution, for a period of time from 1 minute to 15 minutes.

Prior to depositing the coating, the substrate can be pre-treated or cleaned using a basic solution followed by an acidic solution.

Batteries comprising an electrically conductive colored coating on a terminal thereof, wherein the electrically conductive colored coating reflects light within a wavelength range from 400 nm to 700 nm and is selected from a metal oxide coating integrally bonded to the terminal and produced by heat tinting or a titanium nitride containing coating having a thickness from about 10 to 100 nm deposited to the terminal are described herein.

The coating on the battery can exhibit a Scratch Resistance of at least about 4H as determined by ASTM D3363. The electrically conductive colored coating can have a sheet resistance of $2.0 \times 10^{-4}$ ohm/cm or less.

Aerospace structural components comprising a protective coating disposed on at least a surface of the aerospace structural component, wherein the protective coating is derived from a material comprising one or more of aluminum oxide, silicon oxide, a superhydrophobic material, or a combination thereof and has a thickness of 10 nm or greater such as from about 10 nm to about 1000 nm, or from about 100 nm to about 1000 nm, wherein the protective coating has a Scratch Resistance of at least about F as determined by ASTM D3363 are also described.

The protective coating can comprise two or more of aluminum oxide, silicon oxide, or the superhydrophobic material. In some cases, the protective coating further comprises a color layer comprising titanium nitride.

Additional advantages of the disclosed compositions and methods will be set forth in part in the description which follows, and in part will be obvious from the description. The advantages of the disclosed compositions and methods will be realized and attained by means of the elements and combinations particularly pointed out in the appended claims. It is to be understood that both the foregoing general description and the following detailed description are exemplary and explanatory only and are not restrictive of the disclosed compositions, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The patent or application file contains at least one drawing executed in color. Copies of this patent or patent application publication with color drawing(s) will be provided by the Office upon request and payment of the necessary fee.

The accompanying figures, which are incorporated in and constitute a part of this specification, illustrate several aspects of the disclosure, and together with the description, serve to explain the principles of the disclosure.

FIG. 6 shows images of coin cells coated with multicolor patterning enabling the formation of logos.

FIG. 7 shows images of coin cells coated with multicolor patterning enabling the formation of logos.

FIG. 8 is a table showing images of heat tinted coin cells oxidized in air and under various conditions of temperature from 380-400° C., air flow, duration, and pre-treatment.

FIG. 9 is a table showing images of heat tinted coin cells oxidized in air and under various conditions of temperature from 420-440° C., air flow, duration, and pre-treatment.

FIG. 10 is a table showing images of heat tinted coin cells oxidized in oxygen and argon and under various conditions of temperature from 350-440° C., flow rate, duration, and pre-treatment.

FIG. 11 is a table showing images of heat tinted coin cells oxidized in chromic acid and under various conditions of temperature from 65-85° C., duration, and pre-treatment.

DETAILED DESCRIPTION

Figure 1:
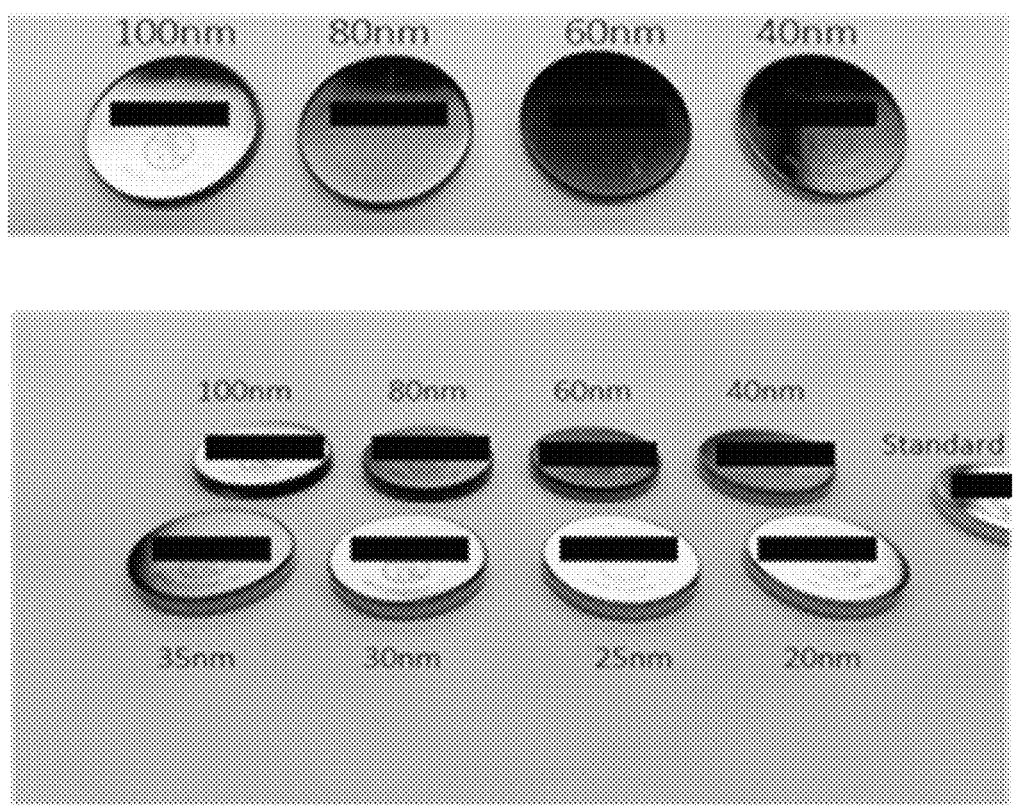
FIG. 1 shows images of coin cells coated with pure titanium nitride.

The compositions and methods described herein may be understood more readily by reference to the following detailed description of specific aspects of the disclosed subject matter and the Examples included therein.

Before the present compositions and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Coated Substrates

Disclosed herein are substrates that are coated with a thin film which provides optical qualities including color and/or abrasion/scratch resistance to the surface of the substrate. The coated substrate may simultaneously exhibit variable assessment parameters selected from one or more of electrical conductivity, resistivity, corrosion resistance, adhesion, hardness, mechanical integrity, durability, cost and commercial viability.

The substrate can be any metal substrate or glass. The metal substrate can comprise or consist of one or more metals known in the art, including, but not limited to, aluminum, magnesium, titanium, nickel, silver, gold, chromium, copper, iron and alloys thereof. In some embodiments, the metal substrate can comprise aluminum. In certain embodiments, the metal substrate can comprise an aluminum alloy. In other certain embodiments, the metal substrate can consist of aluminum. In some embodiments, the metal substrate can comprise nickel. In certain embodiments, the metal substrate can comprise a nickel alloy. In other certain embodiments, the metal substrate can consist of nickel. In some embodiments, the metal substrate can comprise iron. In certain embodiments, the metal substrate can comprise an iron alloy. In other certain embodiments, the metal substrate can consist of iron.

In specific examples, the metal substrate can comprise an iron alloy such as stainless steel. The term stainless steel, is intended to include all the steels classified by the American Iron and Steel Institute as being standard grades of stainless steel. These include the type 400 series stainless steels that contain chromium in amounts of from about 10%, by weight, to about 30%, by weight, and generally less than 1% carbon, such as AISI types 410 and 430 and additionally the A181 type 300 series which contain, in addition to Cr and C, a nickel content of from 6 to 30% which renders the steel structure austenitic, such as AISI type 301, 302 and 304, and the 200 series steels which contain not only nickel in amounts of 1 to 10%, but also up to about 30% Mn and 0.60% N as additional austenitizers. Such various stainless steel analyses may contain additionally, as impurities or alloying ingredients, small amounts of P, S, Cu, Mo, Se, B, Be, Co, W, Ti, Cb, Ta, V, Zn, Al, Si, rare earths, etc. All stainless steels, however, contain chromium within the range of from about 10% to 30% and carbon up to about 1%.

In some examples, the metal substrate can be present on a battery terminal. Such battery terminals can include those present on coin cell batteries (also referred to as button cell batteries), cylindrical battery, prismatic battery or pouch cell battery. Generally, battery terminals can be derived from nickel, aluminum, stainless steel, copper, alloys thereof, or a combination thereof.

In some examples, the metal substrate can be present on an aerospace structural component. Such aerospace structural components can include those used to make bulkheads, flooring transitions, galleys, steps, handrails, handles, other decorative trims, or other areas throughout an aircraft. Generally, the aerospace structural components can be derived from nickel, aluminum, stainless steel, copper, alloys thereof, gold-plated aluminum, gold-plated stainless steel, powder coated aluminum, powder coated stainless steel, or a combination thereof, preferably aluminum or an aluminum alloy.

In some examples, the metal substrate can be an architectural component.

In some examples, the substrate can be a glass.

Colored Coatings

As described herein, the metal substrate can include a colored coating. The term "color" as used herein refers to the quality of a material or object with respect to light reflected or absorbed by the material or object. The three characteristics of color are hue, intensity, and value. "Hue" refers to a gradation, tint, or variety of a color. "Intensity", "chroma", and "saturation" are used interchangeably to refer to the strength or sharpness of a color. A color is full in intensity only when pure and unmixed. "Value" refers to a degree of lightness or darkness in a color. The colored coating provides a desired color for the metal substrate.

The colored coatings preferably absorbs and reflects visible light. In some embodiments, the colored coatings can emit energy having a first wavelength. Excitation of the colored coating by electromagnetic radiation, such as by visible radiation, can result in emission of energy having a first wavelength. As described herein, the colored coating can emit energy having a first wavelength in the visible portion of the electromagnetic spectrum. In some examples, the colored coating can emit energy having a first wavelength of from about 250 nm to about 700 nm. For example, the first wavelength can be about 700 nm or less, 650 nm or less, 600 nm or less, about 550 nm or less, about 500 nm or less, about 450 nm or less, or about 400 nm or less. The first wavelength can be about 250 nm or greater, about 300 nm or greater, about 350 nm or greater, about 400 nm or greater, about 450 nm or greater, about 500 nm or greater, or about 550 nm or greater.

The colored coatings preferably have high conductivity and low resistance. Preferably, the sheet resistance of the original metal substrate should not increase significantly compared to the coated metal substrate. Accordingly, the sheet resistance of the colored coating can be $2.0 \times 10^{-4}$ ohm/cm or less (e.g., $5.0 \times 10^{-4}$ ohm/cm or less, $7.0 \times 10^{-4}$ ohm/cm or less, $8.0 \times 10^{-4}$ ohm/cm or less, $1.0 \times 10^{-5}$ ohm/cm or less, $5.0\times10^{-5}$ ohm/cm or less, $8.0\times10^{-5}$ ohm/cm or less, or $1.0\times10^{-6}$ ohm/cm or less). In some embodiments, the colored coatings can have a sheet resistance within the range of $2.0\times10^{-4}$ to $1.0\times10^{-6}$ ohm/cm (e.g., from $2.0\times10^{-4}$ to $1.0\times10^{-6}$ ohm/cm, from $5.0\times10^{-4}$ to $1.0\times10^{-6}$ ohm/cm, from $1.0\times10^{-5}$ to $1.0\times10^{-6}$ ohm/cm, or from $2.0\times10^{-4}$ to $1.0\times10^{-5}$ ohm/cm). The sheet resistance should be stable over an extended period of time, that is, the increase in resistance should not increase more than 5-10%, based on original sheet resistance after a period of 200 days.

Preferably, the colored coating has a high hardness and is abrasion resistant. In some embodiments, the Mohs Hardness of the colored coating can be greater than the Mohs Hardness of the metal substrate. A person of ordinary skill in the art would know that the Mohs scale is a qualitative ordinal scale that characterizes the scratch resistance of various minerals and materials through the ability of a harder material to scratch a softer material. A person of ordinary skill in the art would know that various minerals are assigned various hardness values on the Mohs scale. In some embodiments, the colored coating can have a Mohs Hardness of at least about 6 (e.g., at least about 7, at least about 8, at least about 9, at least about 10, from about 6 to about 10, from about 7 to about 10, from about 7 to about 9).

In some embodiments, the colored coating includes a ceramic material (also referred to herein as a solid colored coating). Such ceramic material can be selected from a metal nitride such as a transition metal nitride, metal oxynitride, metal carbide, metal oxide, or metal carbonitride. In some examples, the colored coating comprises a transition metal nitride. For example, the colored coating can include a material selected from the group consisting of titanium nitride, titanium carbonitride, chromium nitride, chromium oxynitride, or a mixture thereof.

In specific examples, the colored coating comprises titanium nitride. A color series can be made with titanium nitride coating on the metal substrate; the color being varied by changing the thickness of the titanium nitride coating. Colors ranging from light golds to bronze to purple to blues and greens can be obtained with titanium nitride coatings having a thickness of from 10 nm to 100 nm. In general, the trend of color with increasing thickness is in the following order: pale gold, deep gold, bronze, copper, brown, purple, indigo, blue, green, yellow, orange, and red. The titanium nitride coating also has a high hardness, improving the substrate's surface hardness.

The solid colored coating such as titanium nitride colored coating can have a thickness of 10 nm or greater, such as 15 nm or greater, 18 nm or greater, 20 nm or greater, 25 nm or greater, 30 nm or greater, 35 nm or greater, 40 nm or greater, 45 nm or greater, 50 nm or greater, 55 nm or greater, 60 nm or greater, 65 nm or greater, 70 nm or greater, 75 nm or greater, 80 nm or greater, 85 nm or greater, 90 nm or greater, 95 nm or greater, or 100 nm or greater. In some examples, the solid colored coating such as titanium nitride colored coating can have a thickness of 100 nm or less (e.g., 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less). The thickness of the solid colored coating such as titanium nitride colored coating can range from any of the minimum values described above to any of the maximum values described above. For example, the solid colored coating such as titanium nitride colored coating can have a thickness of from 10 nm to 100 nm (e.g., from 20 nm to 100 nm, from 20 nm to 80 nm, from 20 nm to 60 nm, from 20 nm to 40 nm, from 30 nm to 90 nm, from 30 nm to 70 nm, from 40 nm to 100 nm, from 40 nm to 80 nm, or from 40 nm to 60 nm).

The solid colored coating such as titanium nitride coating has the above properties, as well as the ability, in combination with a suitable metal, to produce intensely colored coatings. In some examples, the colored coating can further comprise an alloying element. The term "alloying" as used herein may refer to an alloy in the conventional sense as denoting a solid mixture of two or more metals. For example, these alloys can contain a metal in addition to titanium. The term "alloying" may also refer to an alloy in the unconventional sense as denoting an additional (second) coating layer in addition to the first titanium nitride layer, wherein the first and second layers have a thickness ratio so that the color of the coating can be changed by varying the thickness of the coating layers.

Depositing a thin layer comprising an alloying element prior to or after the deposition of the first solid coating such as titanium nitride coating can give a more saturated color. With the solid coating such as titanium nitride coatings, many alloying metal can be used to provide a multiple-layer coating with good properties. Preferred colored coatings include metals such as titanium, and metal alloys such as aluminum, nickel, or copper.

In some embodiments, the alloying element can include a metal compound, a metalloid compound, or a combination thereof. For example, the alloying element can comprise a metal selected from the group consisting of Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In certain examples, the alloying element can comprise a metal or a metalloid selected from the group consisting of Al, Cu, Ni, Zn, Ti, and combinations thereof.

The alloying element can, in some examples, be dispersed substantially homogeneously throughout the titanium nitride colored coating. In some examples, the alloying element is not chemically bound in the titanium nitride colored coating.

The colored coating can comprise any suitable amount of the alloying element. For example, the colored coating can comprise 0.1 wt % or more of the alloying element based on the weight of the colored coating (e.g., 0.5 wt % or more, 1 wt % or more, 1.5 wt % or more, 2 wt % or more, 2.5 wt % or more, 3 wt % or more, 3.5 wt % or more, 4 wt % or more, 4.5 wt % or more, 5 wt % or more, 5.5 wt % or more, 6 wt % or more, 6.5 wt % or more, 7 wt % or more, 7.5 wt % or more, 8 wt % or more, 8.5 wt % or more, 9 wt % or more, 9.5 wt % or more, 10 wt % or more, 11 wt % or more, 12 wt % or more, 13 wt % or more, 14 wt % or more, 15 wt % or more, 20 wt % or more, 25 wt % or more, or 30 wt % or more). In some examples, the colored coating can comprise 50 wt % or less of the alloying element based on the weight of the colored coating (e.g., 45 wt % or less, 40 wt % or less, 35 wt % or less, 30 wt % or less, 25 wt % or less, 20 wt % or less, 15 wt % or less, 14 wt % or less, 13 wt % or less, 12 wt % or less, 11 wt % or less, 10 wt % or less, 9.5 wt % or less, 9 wt % or less, 8.5 wt % or less, 8 wt % or less, 7.5 wt % or less, 7 wt % or less, 6.5 wt % or less, 6 wt % or less, 5.5 wt % or less, 5 wt % or less, 4.5 wt % or less, 4 wt % or less, 3.5 wt % or less, 3 wt % or less, 2.5 wt % or less, 2 wt % or less, or 1 wt % or less). The amount of alloying element in the colored coating can range from any of the minimum values described above to any of the maximum values described above. For example, the colored coating can comprise from 0.1 wt % to 50 wt % of the alloying element based on the weight of the hybrid membrane (e.g., from 0.1 wt % to 35 wt %, from 0.1 wt % to 25 wt %, from 0.1 wt % to 13 wt %, from 0.1 wt % to 10 wt %, from 1 wt % to 10 wt %, from 0.1 wt % to 8.5 wt %, or from 1 wt % to 8.5 wt %).

The weight ratio of the first solid coating such as titanium nitride and the alloying element can be from 1:1 or greater (e.g., 2:1 or greater, 3:1 or greater, 4:1 or greater, 5:1 or greater, 10:1 or greater, 15:1 or greater, 20:1 or greater, 25:1 or greater, 30:1 or greater, 40:1 or greater, 50:1 or greater, 60:1 or greater, 70:1 or greater, 75:1 or greater, 80:1 or greater, 85:1 or greater, 90:1 or greater, 95:1 or greater, or 99:1 or greater). The weight ratio of the first solid coating such as titanium nitride and the alloying element can be from 99:1 or less (e.g., 95:1 or less, 90:1 or less, 80:1 or less, 70:1 or less, 60:1 or less, 50:1 or less, 40:1 or less, 30:1 or less, 25:1 or less, 20:1 or less, 15:1 or less, 10:1 or less, 5:1 or less, 2:1 or less, or 1:1 or less). The weight ratio of the first solid coating such as titanium nitride and the alloying element in the colored coating can range from any of the minimum values described above to any of the maximum values described above. For example, the weight ratio of the first solid coating such as titanium nitride and the alloying element can be from 1:1 to 99:1, from 1:1 to 50:1, or from 2:1 to 25:1.

The alloying element colored coating can have a thickness of 1 nm or greater, such as 2 nm or greater, 5 nm or greater, 10 nm or greater, 15 nm or greater, 20 nm or greater, 25 nm or greater, 30 nm or greater, 40 nm or greater, 45 nm or greater, or 50 nm or greater. In some examples, the alloying element colored coating can have a thickness of 100 nm or less (e.g., 50 nm or less, 45 nm or less, 40 nm or less, 35 nm or less, 30 nm or less, 25 nm or less, 20 nm or less, 15 nm or less, 55 nm or less, 50 nm or less, 45 nm or less, 40 nm or less, 35 nm or less, 30 nm or less, 25 nm or less, 20 nm or less, 15 nm or less, 10 nm or less, 8 nm or less, 5 nm or less, or 2 nm or less). The thickness of the alloying element colored coating can range from any of the minimum values described above to any of the maximum values described above. For example, the alloying element colored coating can have a thickness of from 1 nm to 50 nm (e.g., from 2 nm to 50 nm, from 2 nm to 40 nm, from 5 nm to 35 nm, from 5 nm to 20 nm, or from 5 nm to 15 nm).

The colored coating can have an overall thickness of 10 nm or greater, such as 15 nm or greater, 15 nm or greater, 20 nm or greater, 25 nm or greater, 30 nm or greater, 35 nm or greater, 40 nm or greater, 45 nm or greater, 50 nm or greater, 55 nm or greater, 60 nm or greater, 65 nm or greater, 70 nm or greater, 75 nm or greater, 80 nm or greater, 85 nm or greater, 90 nm or greater, 95 nm or greater, or 100 nm or greater. In some examples, the colored coating can have an overall thickness of 200 nm or less (e.g., 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less). The overall thickness of the colored coating can range from any of the minimum values described above to any of the maximum values described above. For example, the colored coating can have an overall thickness of from 10 nm to 100 nm (e.g., from 20 nm to 100 nm, from 20 nm to 80 nm, from 20 nm to 60 nm, from 20 nm to 40 nm, from 30 nm to 90 nm, from 30 nm to 70 nm, from 40 nm to 100 nm, from 40 nm to 80 nm, or from 40 nm to 60 nm).

In some embodiments, the colored coating can be derived from a metal oxide coating. Metal oxide coatings are commonly obtained by heating cleaned metal substrates in oxidizing conditions for a sufficient time for the surface of the substrate to acquire a thin oxide coating generally referred to as a heat tint. Such coating is preferably very thin to avoid taking on the dull, non-metallic, surface-concealing appearance of an oxide scale and, consequently, are insufficiently resistant to slight abrasions and erosive effects to which such coatings may be subjected. The thin metal oxide coatings permit light to penetrate their surfaces and reflect from the surface of the substrate itself. Hence, when one observes a lightly heat tinted surface, one sees the true metallic finish that the substrate surface exhibited prior to the heat tinting, but also observes an interference color in place of the natural appearance of the substrate surface.

The metal oxide colored coating can have an overall thickness of 10 nm or greater, such as 15 nm or greater, 18 nm or greater, 20 nm or greater, 25 nm or greater, 30 nm or greater, 35 nm or greater, 40 nm or greater, 45 nm or greater, 50 nm or greater, 55 nm or greater, 60 nm or greater, 65 nm or greater, 70 nm or greater, 75 nm or greater, 80 nm or greater, 85 nm or greater, 90 nm or greater, 95 nm or greater, 100 nm or greater, 110 nm or greater, 120 nm or greater, 130 nm or greater, 140 nm or greater, 150 nm or greater, 160 nm or greater, 170 nm or greater, 180 nm or greater, 190 nm or greater, or 200 nm or greater. In some examples, the metal oxide colored coating can have an overall thickness of 200 nm or less (e.g., 180 nm or less, 160 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less). The overall thickness of the metal oxide colored coating can range from any of the minimum values described above to any of the maximum values described above. For example, the metal oxide colored coating can have an overall thickness of from 10 nm to 200 nm (e.g., from 10 nm to 150 nm, from 10 nm to 120 nm, from 10 nm to 100 nm, from 20 nm to 100 nm, from 20 nm to 80 nm, from 20 nm to 60 nm, from 20 nm to 40 nm, from 30 nm to 90 nm, from 30 nm to 70 nm, from 40 nm to 100 nm, from 40 nm to 80 nm, or from 40 nm to 60 nm). Thicker coatings do not permit light penetration at all and provide a dull gray or brown appearance commonly associated with an oxide scale. Oxide coatings of less thickness than about 5 nm may not provide sufficient observable reflected interference color to be employed in conjunction with the metal substrates.

The specific metal oxide formed is dependent on the metal substrate being coated. In some embodiments, the metal oxide coatings are crystalline oxide films comprising iron oxide, chromium oxide, molybdenum oxide, copper oxide, nickel oxide, aluminum oxide, or a combination thereof. The difference between the oxide colors and those produced by the solid coatings of titanium nitride described herein is that solid colored coatings effect coloring by the selective absorption of certain wavelengths (intrinsically colored materials), while thin, transparent coatings, such as the oxide coatings, effect coloring by selective interference of light reflected from two different surfaces.

The oxide coated substrates can vary in color from the lighter oxide coatings providing a light yellow or gold to slightly heavier coatings reflecting a bronze appearance, and the heaviest coating reflecting copper, brown, red and blue colors, depending on the exact thickness of the oxide film, which, in turn, depends on the time, temperature and surface conditions wherein the oxide film was created.

Protective Coating

As described herein, the substrate can be coated with a protective coating. The protective coating can be configured to provide increased durability, wearability, and/or lubricity to a substrate. As described herein, the substrate can comprise a metal substrate. Accordingly, the protective coating can be configured to provide increased durability, wearability, and/or lubricity to a metal substrate. In some embodiments, the protective coating can be made from a harder material than the metal substrate. The protective coating can be intimately associated with a substrate onto which it is disposed such that the protective coating can comprise one or more grooves that are substantially identical to the one or more grooves of the substrate onto which it is disposed.

The protective coating can comprise of a variety of materials including, but not limited to minerals such as quartz, topaz, corundum, sapphire, diamond, diamond-like carbon, and combinations thereof. The protective coating can comprise of minerals, gemstones, and/or birthstones, including, but not limited to, diamond, ruby, amethyst, aquamarine, garnet, emerald, tourmaline, topaz, peridot, tanzanite, zircon, turquoise, and the like. In some embodiments, the protective coating can comprise a material comprising of silica, alumina, sol-gels, calcogenides, parylene, fluoropolymers such as polytetrafluoroethylene (PTFE). In specific examples, the protective coating can comprise a material selected from quartz ($SiO_2$), sapphire ($Al_2O_3$), or a superhydrophobic material (such as fluropolymers), and combinations thereof.

The superhydrophobic material can be derived from any suitable material, including polymers and small molecules. In some embodiments, the superhydrophobic material can include a silane. The silane can be halogenated or non-halogenated. In some embodiments, the silane can comprise an alkyl chain, a partially fluorinated alkyl chain, and/or an alkyl chain that has regions that are perfluorinated, any of which may be straight or branched. In some examples, the silane group can comprise one or more perfluorinated aliphatic moieties.

In some examples, the superhydrophobic material can comprise perfluoroalkyltrichlorosilane, perfluoroalkyl(alkyl)dichlorosilane, perfluoroalkyl(alkyl)dialkoxylsilanes, of perfluoroalkyltrialkoxysilanes. Specifically, the functional layer can comprise perfluorododecyltrichlorosilane, perfluorotetradecyltrichlorosilane, perfluorooctyltrichlorosilane, perfluorodecyltrimethoxysilane, perfluorododecyltrimethoxysilane, perfluorotetradecyltrimethoxtsilane, perfluorooctyltrimethoxysilane, perfluorodecyltriethoxysilane, perfluorododecyltrimethoxysilane, perfluorotetradecyltriethoxysilane, perfluorooctyltrimethoxysilane, and perfluorodecylmethyldichlorosilane. In some embodiments, the superhydrophobic material can include a fluorosurfactant. Suitable flourosurfactants can include anionic fluorosurfactants and cationic fluorosurfactants. Examples of suitable fluorosurfactants include those sold under the tradenames FLEXIPEL™, ZONYL®, CAPSTONE®, and MASURF®. Specific examples of suitable fluorosurfactants include FLEXIPEL™ AM-101 partially fluorinated polymer, ZONYL® 9361 anionic fluorosurfactant, CAPSTONE® FS-50 anionic fluorosurfactant, CAPSTONE® FS-63 anionic fluorosurfactant, and MASURF® FP-815CP anionic fluoroacrylate copolymer.

In some examples, the superhydrophobic material can include an evaporation material. Examples of suitable evaporation materials include those sold by Canon Optron Inc. under the tradenames SURFCLEAR100™ or OF-SR™. other evaporation materials that can be used in the protective coating includes materials for optical films including Sift, $Al_2O_3$, S4F™, and S5F™.

The Mohs Hardness of the protective coating can be greater than the Mohs Hardness of the metal substrate. In some embodiments, the protective coating can have a Mohs Hardness of at least about 6 (e.g., at least about 7, at least about 8, at least about 9, at least about 10, from about 6 to about 10, from about 7 to about 10, from about 7 to about 9).

The protective coating can exhibit a Scratch Resistance of at least about F (e.g., at least about at least about H, at least about 2H, at least about 3H, at least about 4H, at least about 5H, at least about 6H, at least about 7H, at least about 8H, from about F to about 6H, from about H to about 6H, from about 4H to about 8H, or from about 4H to about 6H) as determined by ASTM D3363.

The thickness of the protective coating can be at least about 10 nm (for example, at least about 50 nm, at least about 100 nm, at least about 150 nm, at least about 200 nm, at least about 250 nm, at least about 300 nm, at least about 400 nm, at least about 500 nm, at least about 600 nm, at least about 700 nm, at least about 800 nm, at least about 900 nm, or at least about 1000 nm). In some embodiments, the thickness of the protective coating can be from about 10 nm to about 1000 nm (for example, from about 10 to about 750 nm, from about 10 to about 500 nm, from about 100 to about 500 nm, from about 100 nm to about 400 nm, or from about 100 nm to about 300 nm).

Methods of Making

Also described herein are methods of coating the substrates described herein. The colored coating can be disposed onto at least a portion of the metal substrate using various methods including, but not limited to, physical vapor deposition techniques, chemical vapor deposition techniques, chemical techniques, electrochemical techniques, spraying, roll-to-roll coating, heat tinting and the like. In some embodiments, the colored coating can be disposed onto at least a portion of the substrate using sputtering, such as radio frequency sputtering, plating, physical vapor deposition, or heat tinting. In specific examples, the colored coating can also be disposed onto the substrate via radio frequency sputtering. In other specific examples, the disposing the colored coating can comprise heat tinting. In further specific examples, the disposing the colored coating can comprise chemical vapor deposition.

In some examples, a solid colored coating such as titanium nitride can be magnetron sputtered on the metal substrate. Magnetron sputtering of the colored coating can be implemented in a coating chamber. Magnetron sputtering the colored coating can include, under sputtering conditions, using reaction gas such as nitrogen; and applying an electric power to a first target to sputter the first target material onto the metal substrate and deposit the colored coating. The first target can be titanium, for example.

The sputtering conditions can include using an inert sputtering gas (such as argon) having a flow rate of about 5 standard cubic centimeters per minute (sccm) to about 50 sccm; conducting the magnetron sputtering at a sputtering vacuum pressure of about 1 mTorr to about 25 mTorr. The sputter target (such as titanium) can reach a sputtering temperature of about 25° C. to about 100° C., preferably up to 60° C., up to 50° C., or up to 40° C. The substrate can be heated to a temperature from about 250° C. to about 500° C., preferably up to 400° C., or up to 300° C. The sputtering pressure means an internal absolute pressure of a chamber for implementing a sputtering during the magnetron sputtering process. The sputtering temperature means an internal temperature of the chamber for implementing a sputtering during the magnetron sputtering process.

The electric power may be provided by any power source for magnetron sputtering, such as intermediate frequency power source.

Specific examples of making the solid colored coating such as titanium nitride coating can include sputtering conditions having an internal temperature of the coating chamber from room temperature or 25° C. to about 50° C. the substrate can be heated to a temperature of from 250° C. to 350° C., such as about 300° C. Nitrogen ($N_2$) can be used as a reaction gas, and argon gas can be used as a sputtering gas (also known as a working gas) and is injected into the coating chamber at a flow rate of about 5 sccm to about 50 sccm. A power of 150 W to about 500 W can be applied to a titanium target, for example, and titanium atoms are sputtered off from the titanium target. The titanium atoms and nitrogen atoms are then ionized in an electrical field in the coating chamber. The ionized titanium then chemically reacts with the ionized nitrogen to deposit the color layer of titanium nitride (TiN) on the metal substrate. During the depositing process, the substrate can have a negative bias voltage. Depositing of the colored coating can take a few seconds to about 2 hours, a few seconds to about 1 hour, a few seconds to about 15 minutes, or from a few seconds to about 10 minutes.

In other specific examples, sputtering can be conducted at a vacuum pressure of from about 5 mTorr to about 10 mTorr, with a power from about 200 W to about 300 W, and using an inert gas having a flow rate of from about 10 sccm to about 15 sccm as the sputtering gas at a sputtering temperature of from room temperature (about 25° C.) to about 40° C., for about 0.1 min to about 10 mins.

In some embodiments, logos can be placed on the metal substrate by positioning a mask having a predetermined pattern to conceal at least a portion of the metal substrate prior to depositing the electrically conductive colored coating and removing the mask after depositing the electrically conductive colored coating. See for example FIGS. 6 and 7.

Prior to deposition of the coating (for example the colored coating or the protective coating), the substrate can be pre-treated. Pre-treating of the metal substrate can include cleaning the metal substrate. In some examples, pre-treating the metal substrate can comprise contacting the metal substrate with a base (e.g., ammonium hydroxide, sodium hydroxide, or a mixture thereof) and/or acid (e.g., phosphoric acid, sulfuric acid, hydrochloric acid, or a mixture thereof). In some examples, pre-treating the metal substrate can comprise contacting the metal substrate with ammonium hydroxide followed by phosphoric acid.

As described herein, the colored coating can be obtained by heat tinting to form a thin metal oxide coating. The metal oxide coatings can be provided to a metal substrate such as stainless steel by means of heating the substrate in an oxidizing atmosphere. The oxidizing atmosphere can include a gas such as dry air, oxygen, nitrogen, water vapor, or a mixture of oxygen and an inert gas such as argon. In some embodiments, the metallic oxide coatings can be provided to a metal substrate by means of heating the substrate in air, oxygen, or a mixture of oxygen and argon at a temperature of about 250° C. or greater. Preferably the temperature is 500° C. or less, such as from 300° C. to 500° C. or from 300° C. to 450° C. Control over uniformity and repeatability of color can be obtained at lower temperatures and times of greater than two minutes and less than 2 hours. For golds and bronze on most metal substrates, temperatures between about 250° C. to 450° C. can be used. Colors ranging from light golds to bronze to blues and pinks can be obtained between about 250° C. to 500° C. In general, the trend of color with increasing time and temperature is in the following order: pale gold, deep gold, bronze, copper, brown, purple-red, purple, blue and black. Depending on the substrate, some of the colors are missing or are transient. On some substrates, colors are mottled or exhibit a grain at higher temperatures. In general, the colors are all metallic in appearance.

In specific examples, the metal substrate can be heat treated to a temperature from 300° C. to less than 450° C. in the presence of dry air, oxygen, nitrogen, water vapor, or a mixture thereof, having a flow rate of from 250-1000 sccm for a period of time from 0.1 minute to 2 hours, such as from 0.1 minute to 1 hour, or from 5 minutes to 30 minutes.

In some embodiments, the metal oxide coatings can be provided to a metal substrate by means of heating the metal substrate in an oxidizing acid such as chromic acid at a temperature of about 65° C. or greater. Preferably the temperature is 100° C. or less, such as from 65° C. to 85° C. or from 75° C. to 85° C. Control over uniformity and repeatability of color can be obtained at lower temperatures and times of greater than 1 minute and less than 1 hour such as from 1 minute to 10 minutes. Blue greens colors can be obtained between about 75° C. to 85° C. for a period of time from 1 minute to 15 minutes.

When providing the oxide coatings, the substrate's surface can be pre-treated (or cleaned) as described herein, prior to heat treatment. In some instances, if the surface is not clean, the resultant colors may not be uniform or be repeatable. Any known cleaning methods such as those described herein can be used.

In specific examples, the metal substrate can be pre-treated with ammonium hydroxide followed by phosphoric acid to form a pre-treated substrate. The pre-treated substrate is then heat treated to a temperature from 75° C. to less than 85° C. in the presence of chromic acid solution, for a period of time from 1 minute to 15 minutes.

Metal oxide coatings which fall within the scope of the present application can be produced by electrolytic treatment in caustic solutions. Consequently, all such metal oxide coatings may be employed in the manufacture of the present coated article. Since the metal oxide coatings, as applied to the substrate, are basically caused by an oxidation of the substrate's surface itself, the metal oxide coatings are integrally bonded to the surface of substrate rather than having a mechanical bond as provided by some solid colored coatings.

The protective coating can be disposed onto at least a portion of the metal substrate using various methods including, but not limited to, physical vapor deposition techniques, chemical vapor deposition techniques, chemical techniques, electrochemical techniques, spraying, roll-to-roll coating, and the like. The protective coating can be disposed onto at least a portion of the substrate using ion assisted deposition (IAD), atomic layer deposition (ALD), and plasma enhanced chemical vapor deposition (PECVD), sputtering, thermal evaporation, electron-beam evaporation, plasma spraying, and the like. In some embodiments, the protective coating can also be disposed onto the substrate via spin coating, dip coating, and the like. In specific examples, disposing the protective coating can comprise ion assisted deposition. In other specific examples, disposing the protective coating can comprise atomic layer deposition.

In some embodiments, disposing the protective coating can be performed at a temperature less than the degradation temperature of the metal substrate. For example, disposing the protective coating can be performed at a temperature of less than about 600° C.

The metal substrate preferably has a finish that is glossy and is smooth to the touch depending, of course, on the original surface, and the color has considerable depth. The coated metal substrates are preferably resistant to rubbing or scratching type of abrasion, much more so than the base metal or uncoated article. The coated substrates are particularly resistant to chemical attack, particularly to effect corrosion resistance.

Methods of Use

Also disclosed herein are methods of using the coated substrates. The coated substrates can be used in articles requiring color differentiation such as in batteries but can also be employed for other decorative uses such as automobile trim or decorative members for appliances. The coated substrates can be used in articles requiring increased durability, wearability, and/or lubricity such as in aerospace structural component.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1: Functional Decorative Coatings

Color differentiation is a key commercial product attribute. This example considers and assesses several technologies (plating, evaporation, physical vapor deposition, heat tinting, etc.) and/or chemistries/materials (TiN, Cu, black nickel, etc.) that may be used to impart color (copper, black, gold, etc.) to battery products. Critical assessment variables are color, resistivity, corrosion resistance, adhesion, hardness, mechanical integrity, durability, cost and commercial viability.

Evaluation of Titanium Nitride (TiN) Coatings Deposited on 2032 Coin Cell:

In an effort to produce the visually distinctive "copper top" for coin cell batteries, titanium nitride (TiN) coatings deposited on 2032 coin cell 'cans' via radio frequency (RF) sputter deposition were evaluated. Twenty (20) depositions were made as described in Table 1. Each deposition run contained approximately one dozen individual 2032 coin cell cans.

All depositions used the same basic parameters: 12 sccm Ar, 8 mTorr process pressure, 274 W RF, at a rate of 0.32 Å/s.

The color of the thin films was analyzed using a Konica Minolta CR-400 Chroma Meter. The measurements obtained removed the reflective nature (of 'shininess') and were made in L* a* b* color space, then converted to RGB. As a control, the color of Duracell Copper (Pantone 876C) was determined.

TABLE 1

Titanium nitride (TiN) coatings deposited on 2032 coin cell 'cans' via radio frequency (RF) sputter deposition.

| Sample | Method | Coating composition |
|---|---|---|
| 1 | Co-Sputter | 100 nm TiN |
| 2 | RF Sputter | 80 nm TiN |
| 3 | RF Sputter | 60 nm TiN |
| 4 | RF Sputter | 40 nm TiN |
| 5 | RF Sputter | 35 nm TiN |
| 6 | RF Sputter | 30 nm TiN |
| 7 | RF Sputter | 25 nm TiN |
| 8 | RF Sputter | 20 nm TiN |
| 9 | Co-Sputter | 80 nm TiN:20 nm Al |
| 10 | Co-Sputter | 32 nm TiN:8 nm Al |
| 11 | Co-Sputter | 60 nm TiN:20 nm Al |
| 12 | Co-Sputter | 24 nm TiN:16 nm Al |
| 13 | Co-Sputter | 40 nm TiN:40 nm Al |
| 14 | Co-Sputter | 30 nm TiN:30 nm Al |
| 15 | RF Sputter | 90 nm TiN |
| 16 | RF Sputter | 70 nm TiN |
| 17 | RF Sputter | 50 nm TiN |
| 18 | Co-Sputter | 45 nm TiN:5 nm Al |
| 19 | Co-Sputter | 36 nm TiN:4 nm Al |
| 20 | Co-Sputter | 36 nm TiN:4 nm Al |

Results

Figure 2:
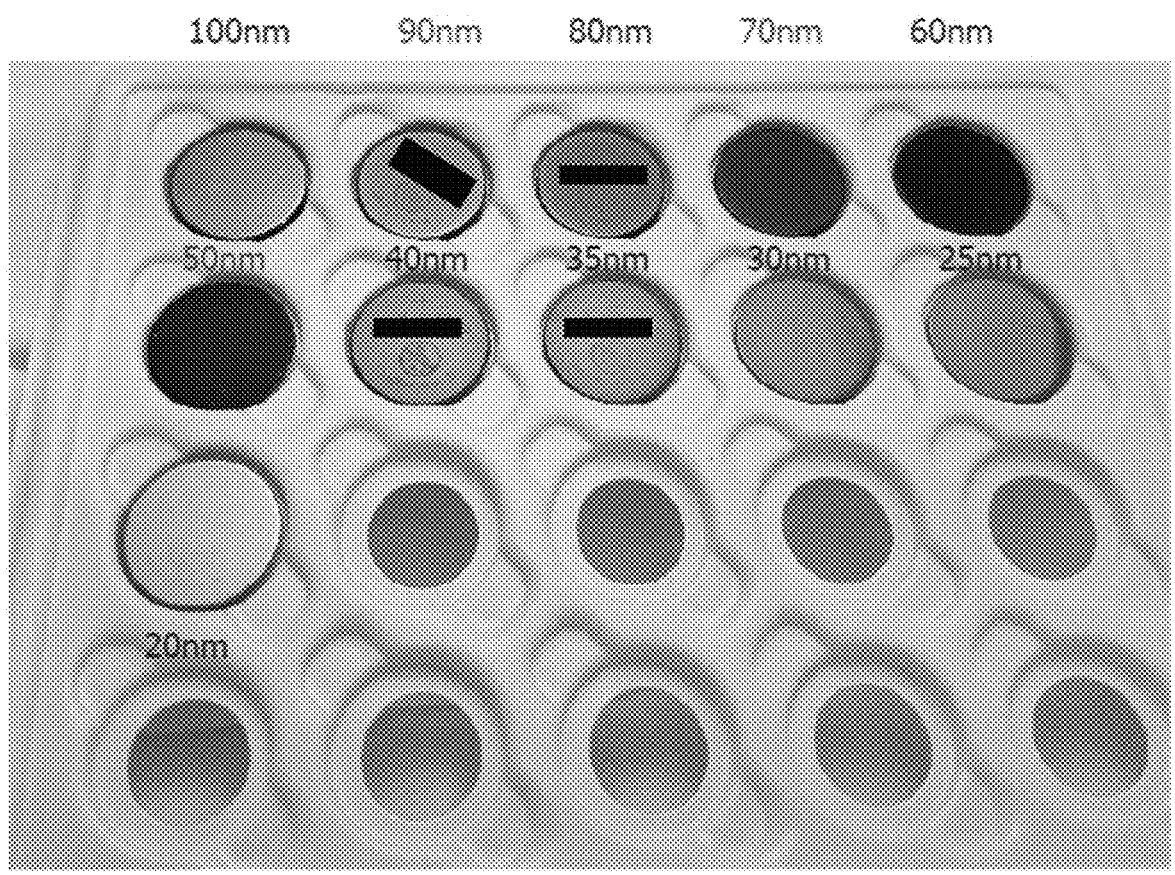
FIG. 2 shows images comparing coin cells coated with pure titanium nitride and aluminum as a function of thickness.

Color Analysis of titanium nitride coatings: a wide range of colors were observed in the pure titanium nitride thin film coatings as shown in FIGS. 1-2. The coatings slowly changed color when brought from vacuum conditions to atmosphere as nitrogen is adsorbed into the film, creating stoichiometric stability. Oxygen may play a role as well. Overall, the coarse color of the coin cells was governed by thickness of the titanium nitride layer.

Figure 3:
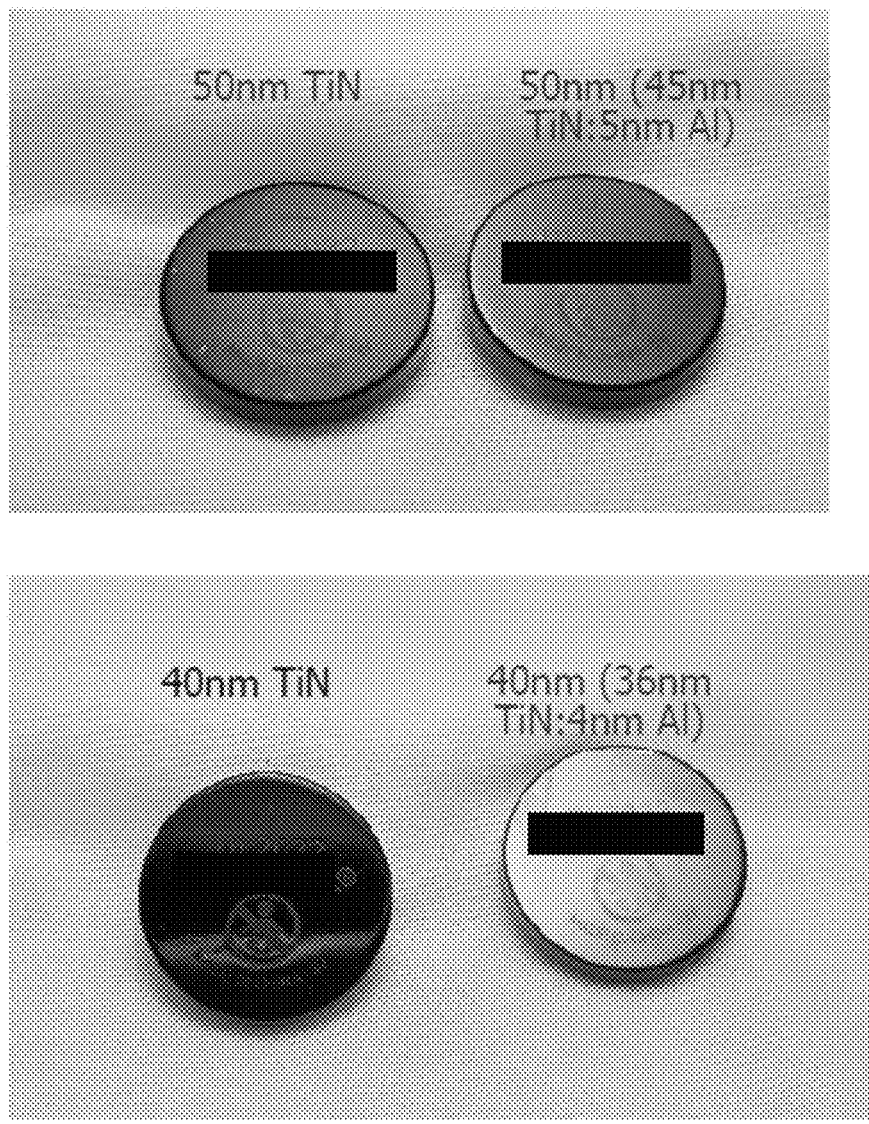
FIG. 3 shows images of coin cells coated with an alloy of titanium nitride and aluminum.
Figure 4:
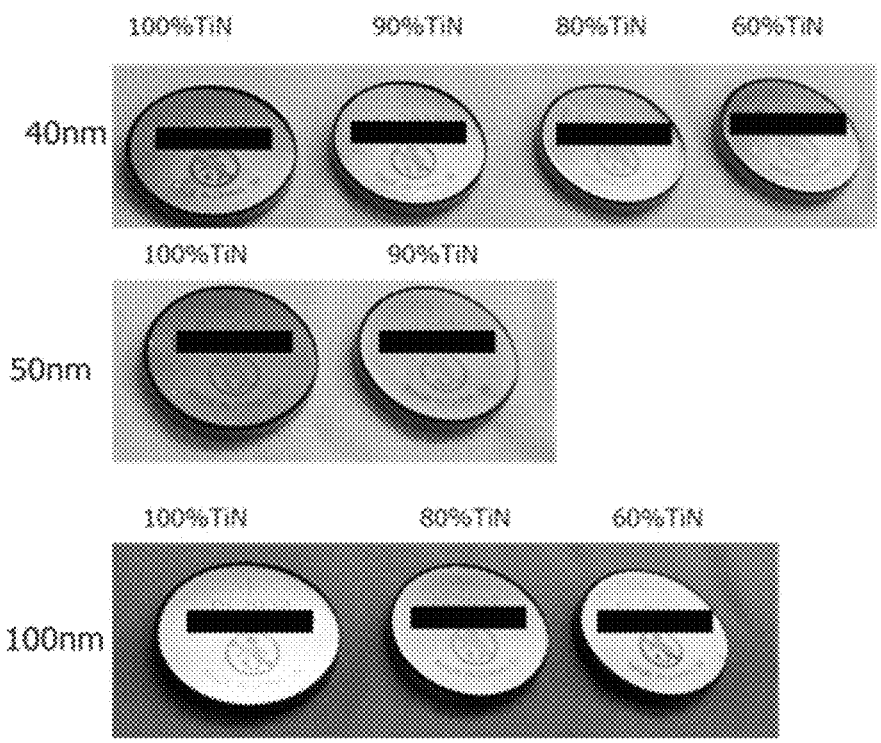
FIG. 4 shows images comparing coin cells coated with an alloy of titanium nitride and aluminum as a function of increasing aluminum concentration.
Figure 5:
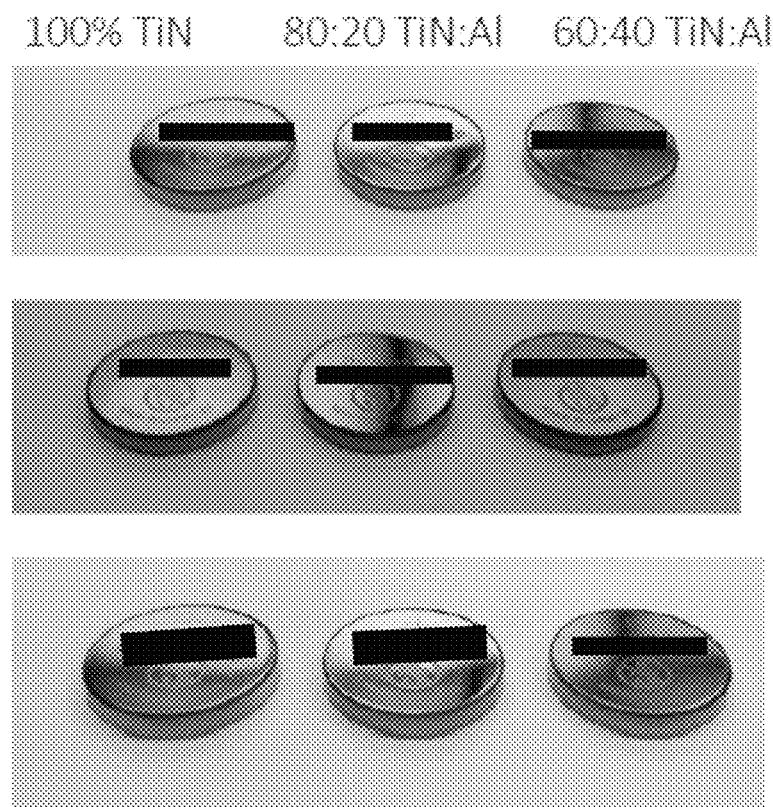
FIG. 5 shows images comparing coin cells coated with an alloy of titanium nitride and aluminum as a function of increasing aluminum concentration.

A wide range of colors were also observed in the titanium nitride:aluminum thin film coatings as shown in FIGS. 3-5. Overall, the fine color of the coin cells was governed by alloying of the titanium nitride layer. The 20 nm to 40 nm range showed the best correlation to copper coloring as shown in FIG. 5.

There was no observable difference between coloration of 2032 and 2016 type coin cells (results not shown).

The L* a* b* and RGB values of the thin films are shown in Table 2. The control, Duracell Copper (Pantone 876C), has a RGB approximation of 136/99/75. A standard Ni plated 2032 Duracell coin cell has an L* value of 69.77, an a* value of 0.11, and a b* value of 6.39. The RGB approximation is 174/170/159.

TABLE 2

Color analysis of titanium nitride coatings.

| Thickness | 40 nm | 40 nm | 35 nm | 35 nm | 30 nm | 30 nm | 25 nm | 25 nm | 20 nm | 20 nm |
|---|---|---|---|---|---|---|---|---|---|---|
| L* | 26.77 | 28.19 | 31.02 | 31.02 | 42.06 | 39.81 | 47.89 | 48.1 | 54.56 | 54.64 |
| a* | 21.41 | 19.07 | 18.44 | 16.88 | 9.65 | 10.78 | 5.51 | 5.46 | 2.37 | 2.5 |
| b* | 22.35 | 27.43 | 39.74 | 39.73 | 43.14 | 44.34 | 37.23 | 37.3 | 29.5 | 29.65 |
| R | 98 | 100 | 108 | 106 | 127 | 123 | 136 | 136 | 147 | 148 |
| G | 49 | 54 | 61 | 62 | 93 | 86 | 109 | 110 | 128 | 128 |
| B | 30 | 24 | 3 | 3 | 22 | 12 | 49 | 49 | 79 | 79 |

| Thickness | 100 nm | 100 nm | 90 nm | 90 nm | 80 nm | 80 nm | 70 nm | 70 nm | 60 nm | 60 nm | 50 nm | 50 nm |
|---|---|---|---|---|---|---|---|---|---|---|---|---|
| L* | 50.9 | 49.1 | 40.5 | 40.9 | 35.2 | 34.6 | 29.1 | 29.9 | 14.9 | 14.1 | 13.2 | 10.8 |
| a* | −10.9 | −10.6 | −9.9 | −10 | −7.3 | −7.1 | −5.6 | −5.3 | 17.9 | 21.5 | 28.7 | 31.8 |
| b* | 9.8 | 9.8 | −14.5 | −13.3 | −21.3 | −21.0 | −27.4 | −28.4 | −34.6 | −34.9 | −33.1 | −33.3 |
| R | 107 | 84 | 63 | 66 | 48 | 47 | 23 | 23 | 0 | 41 | 52 | 50 |
| G | 127 | 122 | 101 | 102 | 87 | 86 | 73 | 74 | 46 | 25 | 15 | 4 |
| B | 104 | 142 | 119 | 118 | 117 | 115 | 111 | 114 | 87 | 86 | 81 | 76 |

Thermochemical heat-tinting: Thermochemical 'heat-tinting' was conducted under a temperature (<~500° C.) and atmospheric tempering conditions of thermal air oxidation, oxygen/argon thermal oxidation, and acid coloration, tailored to impart durable color to the metal used to manufacture coin cells. Twenty (20) deposition runs (each consisting of a half-dozen stainless steel coin cell cans) were conducted as described in Tables 3-5.

Thermal Air Oxidation: in this method, substrates were heated to between 250° C. and 450° C., in standing to 1 L/min ambient air. In some instances, substrates were pretreated by submersion in 50% $NH_4OH$, followed by a solution of 2% $H_3PO_4$.

Oxygen/Argon Thermal Oxidation: in this method, substrates were heated to between 350° C. and 500° C. in 250 sccm O2, 250 sccm Ar. In some instances, substrates were pretreated by submersion in 50% $NH_4OH$, followed by a solution of 2% $H_3PO_4$.

Acid coloration—chromic acid: substrates were pretreated by submersion in 50% $NH_4OH$, followed by a solution of 2% $H_3PO_4$. The substrates were then immersed in chromic acid solution at temperatures between 65° C. and 85° C. for 1 to 10 minutes.

The resistivity and contact resistance of the coatings were also determined with four point probe measurements, while color was assessed with optical reflectometry. Rockwell Hardness and scratch testing were also conducted.

Friction Test Experimental Setup: sample durability was tested using a Mark-10 digital force gauge. The samples were adhered to a test sled with a mass of 215 g then pulled 65 mm at 500 mm per second across 1200 and 320 grit silicon carbide paper.

Results

Color analysis of heat tinting treatments: Heat treating the substrates in air resulted in colorations ranging from light gold to bronze, as shown in FIGS. 8-9. Heat treating the substrates in $O_2$ and Ar resulted in colorations ranging from light gold to bronze to blues and pinks, as shown in FIG. 10. For the acid treatments, no visible effect on the substrates at 65° C. was observed, but at elevated temperatures a blue-green color developed, as shown in FIG. 11.

The L* a* b* and RGB values of the thin films are shown in Tables 3-5.

TABLE 3

Color analysis of air treatments.

| | Air | | | | | | |
|---|---|---|---|---|---|---|---|
| | 380° C. | 380° C. | 400° C. | 400° C. | 420° C. | 420° C. | 440° C. |
| Duration | 1 hr, 0 L/m | 1 hr, 1 L/m | 1 hr, 1 L/m | 2 hr, 1 L/m | 1 hr, 1 L/m | 2 hr, 1 L/m | 1 hr, 1 L/m |
| L* | 61.68 | 60.77 | 59.68 | 51.04 | 50.86 | 54.14 | 58.18 |
| a* | 1.24 | 2.19 | 3.65 | 7.09 | 8.42 | 9.26 | 8.16 |
| b* | 24.13 | 25.46 | 28.04 | 31.36 | 34.38 | 24.99 | 24.82 |
| R | 163 | 187 | 163 | 145 | 146 | 155 | 165 |
| G | 147 | 186 | 141 | 116 | 116 | 123 | 134 |
| B | 106 | 181 | 94 | 67 | 61 | 87 | 97 |

TABLE 4

Color analysis of argon/$O_2$ treatments

| 50:50 Ar:$O_2$ | 380° C. | 440° C. | 500° C. | 500° C. | 500° C. |
|---|---|---|---|---|---|
| Duration | 1 hr | 1 hr | 1 hr | 1 hr | 1 hr |
| L* | 48.66 | 42.12 | 37.72 | 38.82 | 49.59 |
| a* | 9.06 | 15.31 | 8.9 | 12.94 | 5.05 |
| b* | 34.23 | 26.48 | 9.83 | 10.29 | 10.89 |
| R | 143 | 132 | 107 | 116 | 132 |
| G | 109 | 89 | 83 | 83 | 115 |
| B | 57 | 56 | 73 | 75 | 100 |

TABLE 5

Color analysis of chromic acid treatments

| Chromic acid | 65° C., 1 min | 65° C., 5 min | 75° C., 10 min | 80° C., 15 min | 85° C., 15 min |
|---|---|---|---|---|---|
| L* | 74.73 | 75.45 | 52.07 | 40.44 | 49.45 |
| a* | −0.01 | −0.1 | −3.69 | 1.61 | −1.97 |
| b* | 3.35 | 2.84 | 2.19 | 10.21 | 20.92 |
| R | 186 | 187 | 119 | 103 | 124 |
| G | 184 | 186 | 126 | 94 | 118 |
| B | 178 | 181 | 120 | 79 | 82 |

Figure 12:
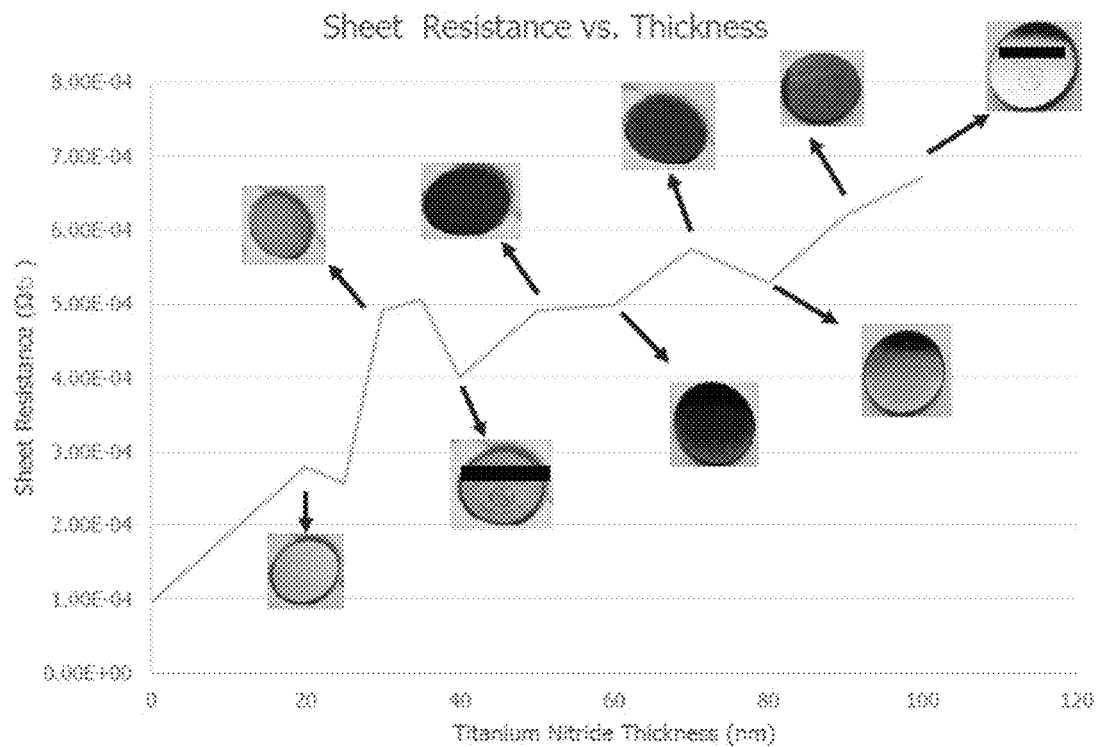
FIG. 12 is a line graph showing the sheet resistance of coatings as a function of titanium nitride thickness.

Resistivity and contact resistance: the resistivity and contact resistance of the coatings is shown in FIG. 12 and Table 6. The RF Sputter and heat tint resistance are both very low. The original CR2032 cell has a resistance of approximately 0.000001 Ω-cm.

TABLE 6

Resistivity and contact resistance of coatings.

| Film Thickness | Ω/cm | Std. Dev. |
|---|---|---|
| 100 nm | 0.000671 | 0.000362 |
| 90 nm | 0.000619 | 0.000133 |
| 80 nm | 0.000529 | 0.000267 |
| 70 nm | 0.000574 | 0.000223 |
| 60 nm | 0.000499 | 0.000143 |
| 50 nm | 0.000491 | 0.000206 |
| 40 nm | 0.0004 | 0.000168 |
| 35 nm | 0.000506 | 0.0000925 |
| 30 nm | 0.000491 | 0.000109 |
| 25 nm | 0.000257 | 0.0000936 |
| 20 nm | 0.000279 | 0.0000781 |
| STD 2032 | 9.6305e−05 | 9.83e−06 |

Figure 13:
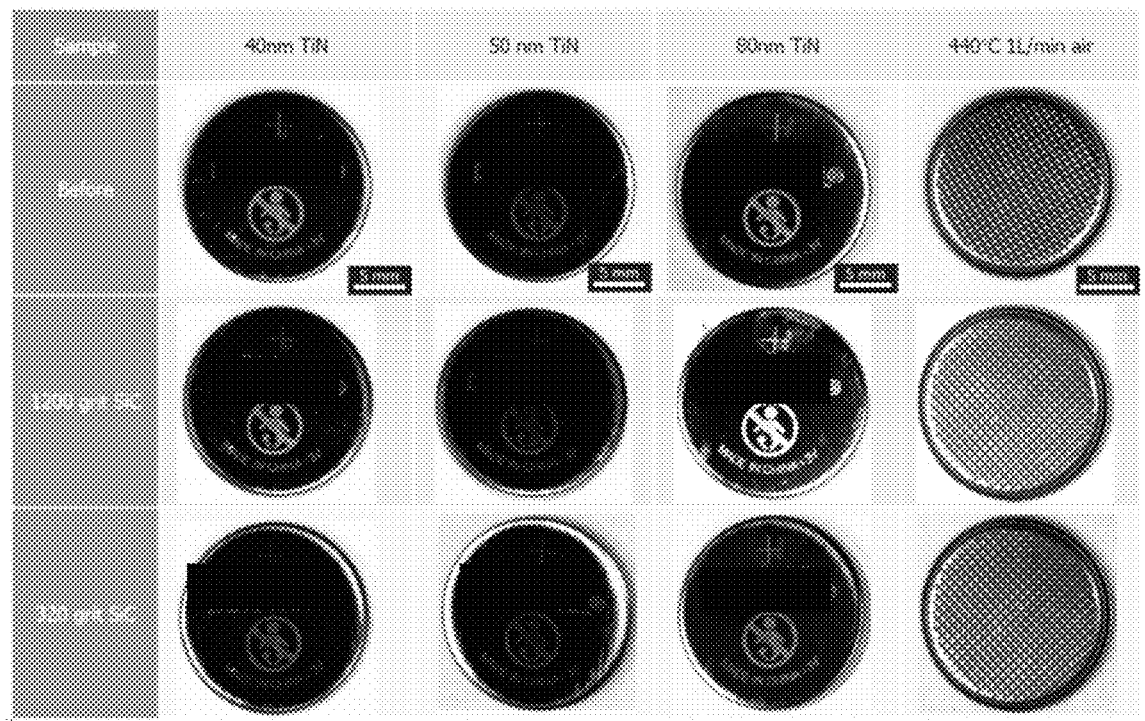
FIG. 13 shows images demonstrating the durability of coatings described herein.
Figure 14:
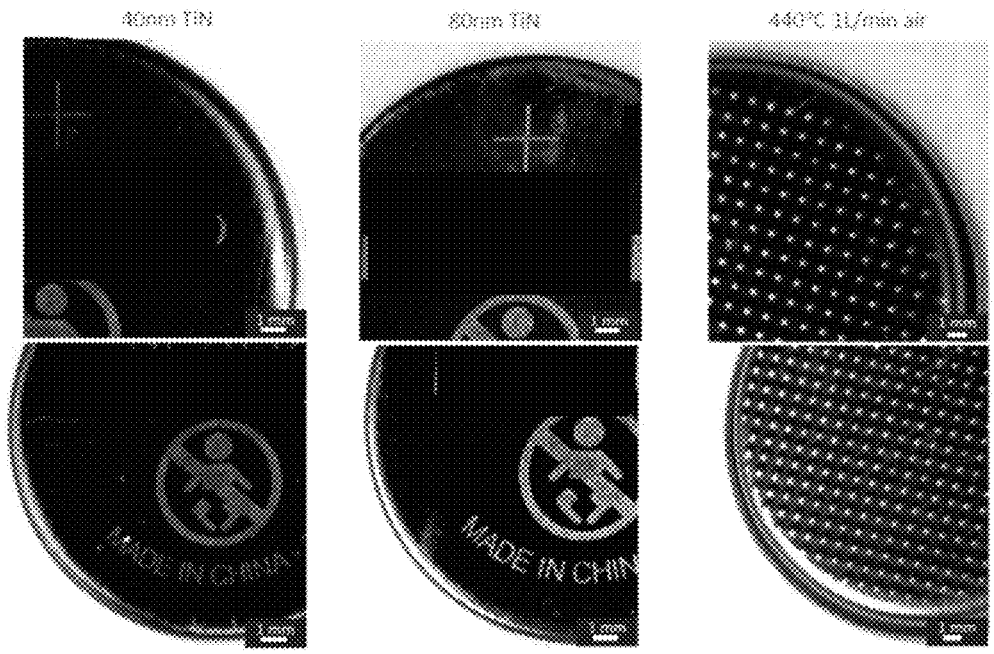
FIG. 14 shows images demonstrating the durability of coatings described herein when contacted with a 1200 Grit SiC paper.
Figure 15:
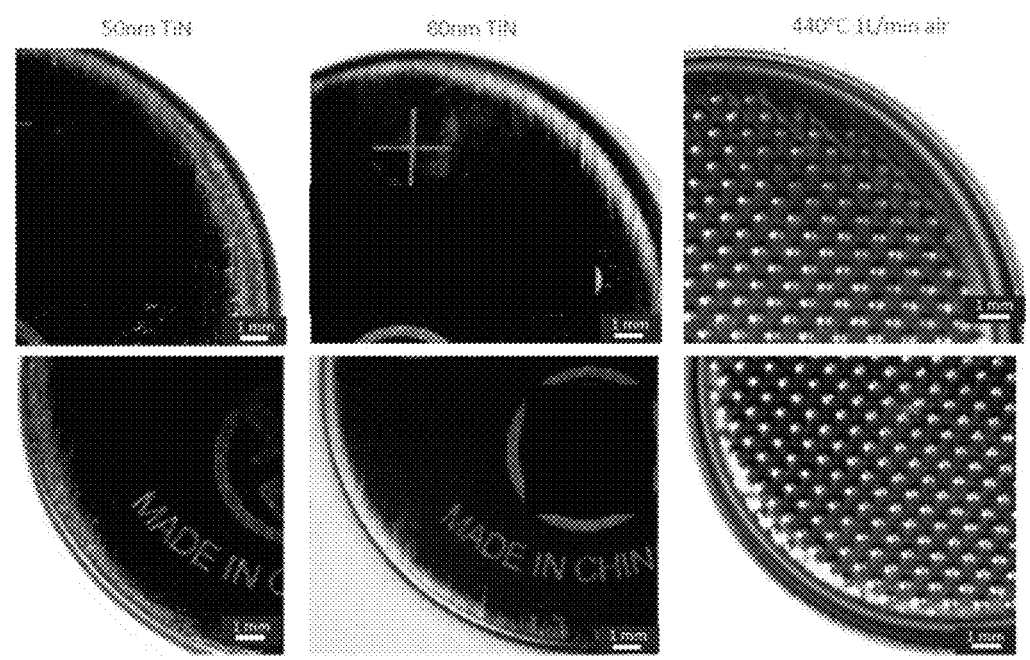
FIG. 15 shows images demonstrating the durability of coatings described herein when contacted with a 320 Grit SiC paper.

Friction Test Experimental Setup: the sample durability as determined by a Mark-10 digital force gauge is shown in FIGS. 13-15. There was noticeable scratching on the outside edges of the TiN samples, and no noticeable scratching on the 440° C. heat tinted sample using a 1200 Grit SiC Paper. There was noticeable scratching on the outside edges of the TiN samples, and no noticeable scratching on the 440° C. heat tinted sample using a 320 Grit SiC Paper.

Figure 16:
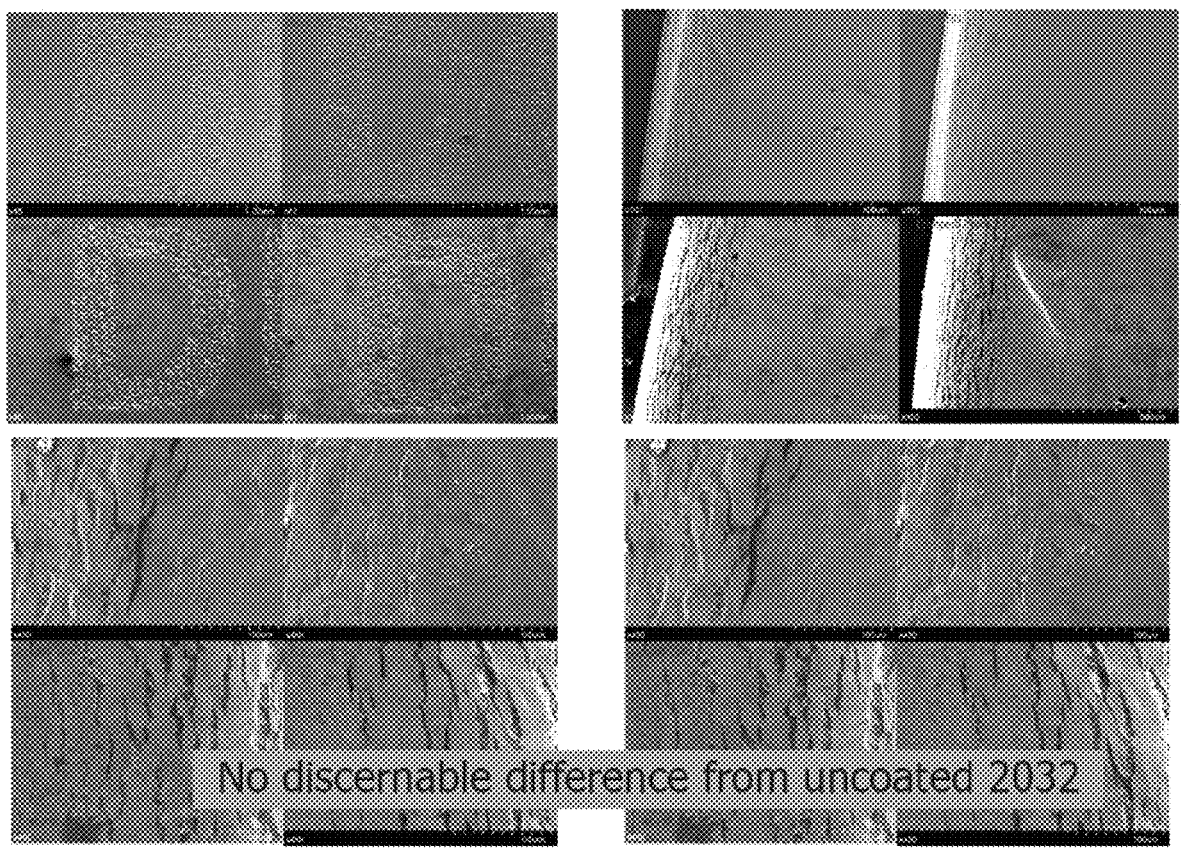
FIG. 16 shows scanning electron microscopic images of coated and uncoated 2032 coin cell batteries.

Scanning Electron Microscopy was used to evaluate the coated and coated coin samples. No discernable difference was observed between the coated and uncoated 2032 coin samples as shown in FIG. 16.

Example 2: Protective Coatings to Provide Scratch Resistance

Coatings on aluminum for use in bulkheads, flooring transitions, galleys, and other areas throughout aircrafts were designed. This example utilizes vacuum- and plasma-based thin film deposition technologies to create nanoscale (~100 nm) protective layers of quartz ($SiO_2$), sapphire ($Al_2O_3$) and/or titanium nitride (TiN).

Quartz ($SiO_2$) deposition to impart scratch resistance: Nominally-transparent quartz ($SiO_2$)-based materials coated via electron beam evaporation upon substrates to impart scratch resistance were investigated. These engineered materials were deposited as an approximately 200 nm thick layer via ion assisted deposition (IAD) on at least thirteen substrate specimens approximately 3"×3" and made from aluminum and thirteen similar ~3"×3" samples made from stainless steel, with an additional 6 samples being 3"×12", 3 of which are made of aluminum and 3 of which are made of stainless steel.

Sapphire ($Al_2O_3$) deposition to impart scratch resistance: Nominally-transparent sapphire ($Al_2O_3$)-based materials coated via electron beam evaporation upon substrates to impart scratch resistance were investigated. These engineered materials were deposited as an approximately 200 nm thick layer via IAD on at least thirteen substrate specimens approximately 3"×3" and made from aluminum and thirteen similar ~3"×3" samples made from stainless steel, with an additional 6 samples being 3"×12", 3 of which are made of aluminum and 3 of which are made of stainless steel.

Titanium nitride (TiN) deposition to impart decorative colorization & scratch resistance: In an effort to produce visually distinctive interiors for aircraft, titanium nitride (TiN) coatings deposited on substrates via radio frequency (RF) sputter deposition were investigated. Sixteen depositions were made. These engineered materials were deposited as an approximately 100 nm thick layers on at least thirteen substrate specimens approximately 3"×3" and made from aluminum and thirteen {13} similar ~3"×3" samples made from stainless steel, with an additional 6 samples being 3"×6", 3 of which are made of aluminum and 3 of which are made of stainless steel. The EvoVac sputter deposition tool has been shown to impart a simultaneously decorative and hard, protective and scratch-resistant coating. The process is highly tailorable, with "coarse" color adjustments obtained through deposition thickness adjustments, and fine hue adjustments being achieved through "doping" of the material with a second co-sputtered alloy.

Characterization: The coatings were assessed for their optical qualities/color, physical morphology, adhesion, hardness, and abrasion/scratch resistance.

Optical Qualities/Color: an optical microscopy and colorimetry was used to characterize the appearance of the coatings on the aforementioned coated samples at visible wavelengths of light.

Physical Morphology: a scanning electron microscopy (SEM) was used to assess the aforementioned coated sample coupons in terms of morphological aspects of the deposited material upon the underlying substrate.

Adhesion/Hardness/Abrasion/Scratch Resistance: microhardness and two body abrasion tests were used to assess the aforementioned coated sample coupons in terms of hardness and abrasion/scratch resistance of the deposited material upon the underlying substrate.

Results:

$Al_2O_3$ Pencil Hardness Testing on deposited samples of variable thicknesses: the pencil hardness of test samples was evaluated using ASTM D3363. The results are shown in Table 7.

TABLE 7

Pencil Hardness Testing on deposited samples

| Name | Thickness (nm) | 6 H | 5 H | 4 H | 3 H | 2 H | H | F | H B | B | 2B | 3B | 4B | 5B | 6B |
|---|---|---|---|---|---|---|---|---|---|---|---|---|---|---|---|
| GA2 | 100 | ✓ | ✓ | ✓ | ✓ | ✓ | ✓ | ~ | X | X | X | X | X | X | X |
| GA3 | 200 | ✓ | ✓ | ✓ | ✓ | ✓ | ✓ | ~ | X | X | X | X | X | X | X |
| GA4 | 400 | ✓ | ✓ | ✓ | ✓ | ✓ | ✓ | ~ | X | X | X | X | X | X | X |
| GA5 | 600 | ✓ | ✓ | ✓ | ✓ | ✓ | ✓ | ~ | X | X | X | X | X | X | X |
| GA6 | 1000 | ✓ | ✓ | ~ | X | X | X | X | X | X | X | X | X | X | X |

As the $Al_2O_3$ thickness increased with each sample, the pencil hardness was measured and recorded for resistance to scratch indentation. There was not an obvious change in scratch resistance until the thickness reached 1000 nm.

Sample GA2

Figure 17:
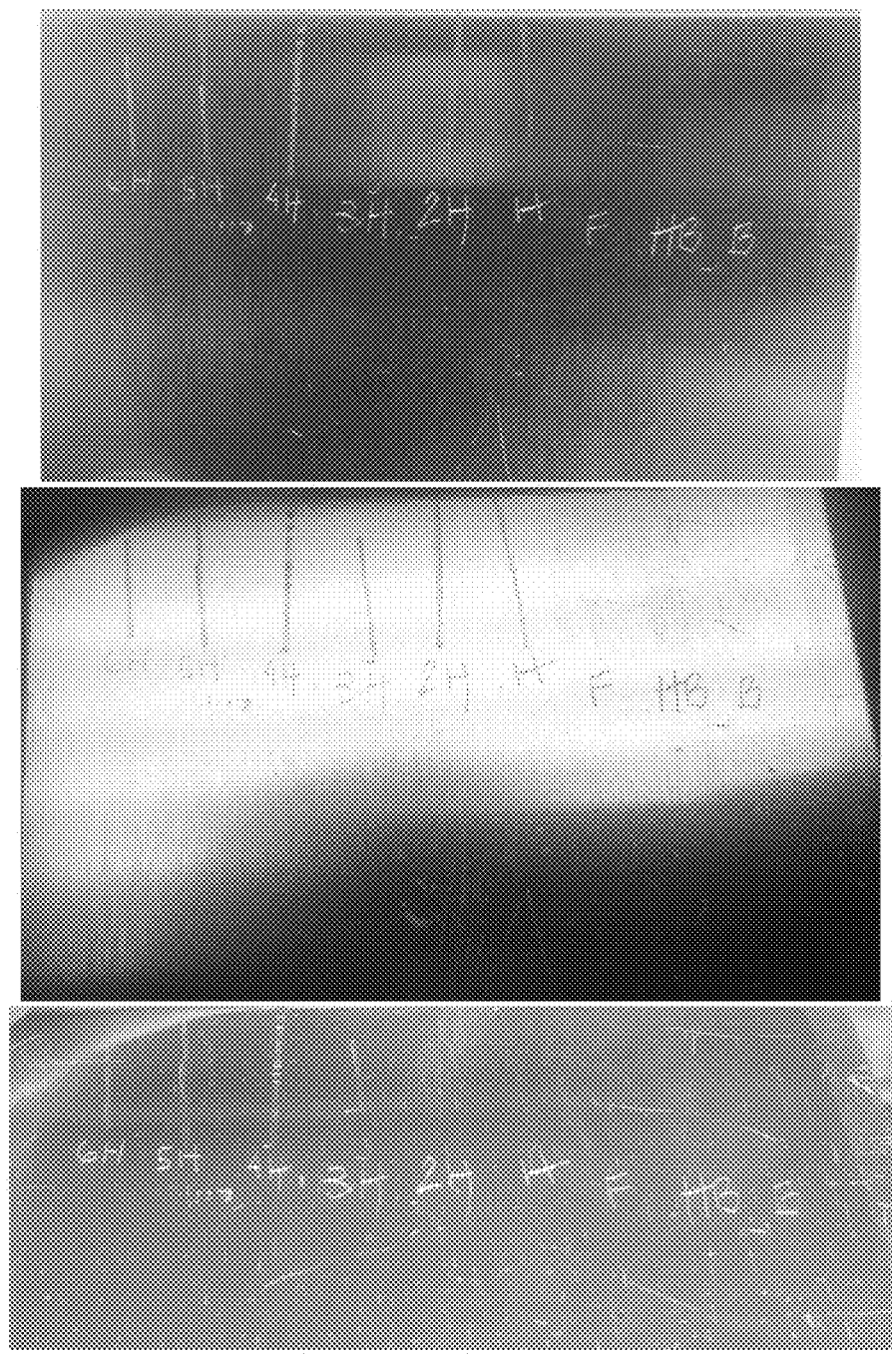
FIG. 17 shows full display images demonstrating the pencil hardness values and angled open-faced slight right (top), forward (middle), and downward (bottom) of aluminum oxide coated substrates. The coating has a thickness of 100 nm.

FIG. 17 (top) shows a full display (angled open-faced slight right) of pencil hardness values; gouge hardness occurs at F.

FIG. 17 (middle) shows a full display (angled forward) of pencil hardness values; a yellow tinted smear was observed from rubbing off scratch.

FIG. 17 (bottom) shows a downward angle of full display of pencil hardness values; the scratch was observed to fade after F.

The scratches started becoming less invasive at 2H, but still cut through surface. Immediate change in indentation depth from pencil hardness H to F. H was a thin, yet intrusive scratch, while F did not create a carving through the coating and did not resist the force to push the hardness tool. At pencil hardness (B) the resultant "scratch" was able to be completely rubbed off, therefore I stopped testing beyond B.
Sample GA3

Figure 18:
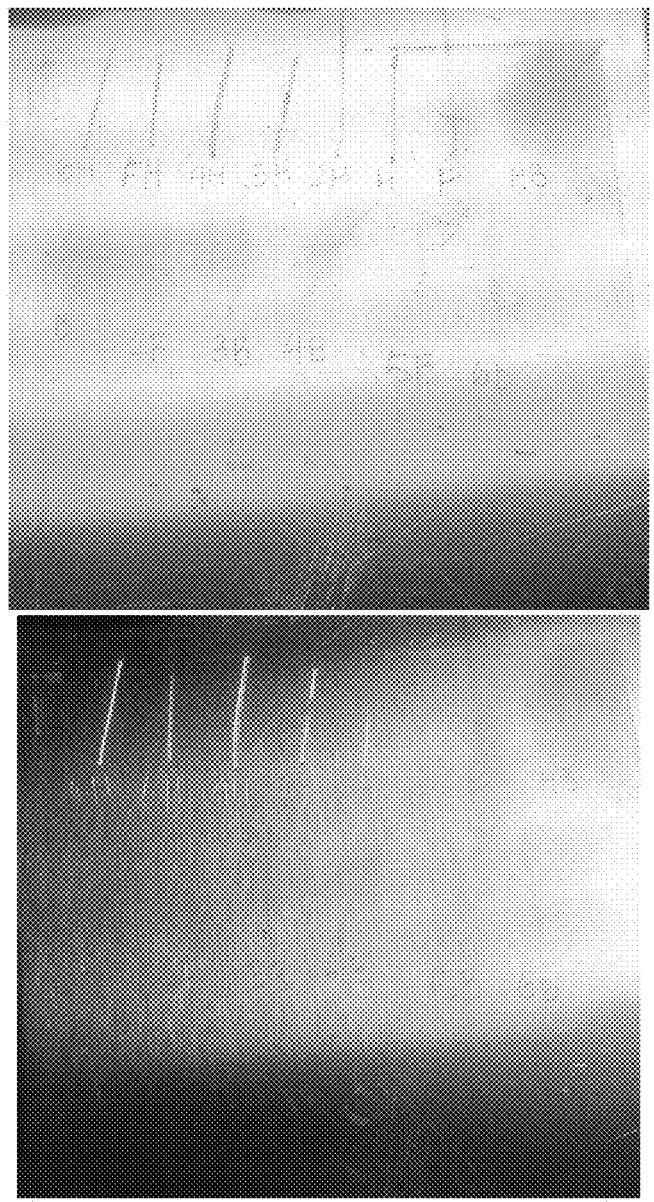
FIG. 18 shows full display images demonstrating the pencil hardness values and deformation (top) and pencil hardness captured at a different angle for scratch indentation detail (bottom) of aluminum oxide coated substrates. The coating has a thickness of 200 nm.

FIG. 18 (top) shows a full display of pencil hardness values and deformation. A smeared purple tint and no indentation was noticed.

FIG. 18 (bottom) shows a full display of pencil hardness captured at different angle for scratch indentation detail. Invasive deformation was noticed at 5H-3H.

It was noted that the scratch became slightly weaker beginning around 4H, but still indents through coating. Around 2H, another evident change to weaker indentation—skinny scratch (still intrusive to coating). At pencil hardness F, resistance to push weakened and created a skinny indentation for about 3 mm followed by a pink scratch that did not penetrate coating. At pencil hardness HB and forward, pink scratch was created at testing but became barely visible after rubbing. (smudging occurred from rubbing-see images above).
Sample GA4

Figure 19:
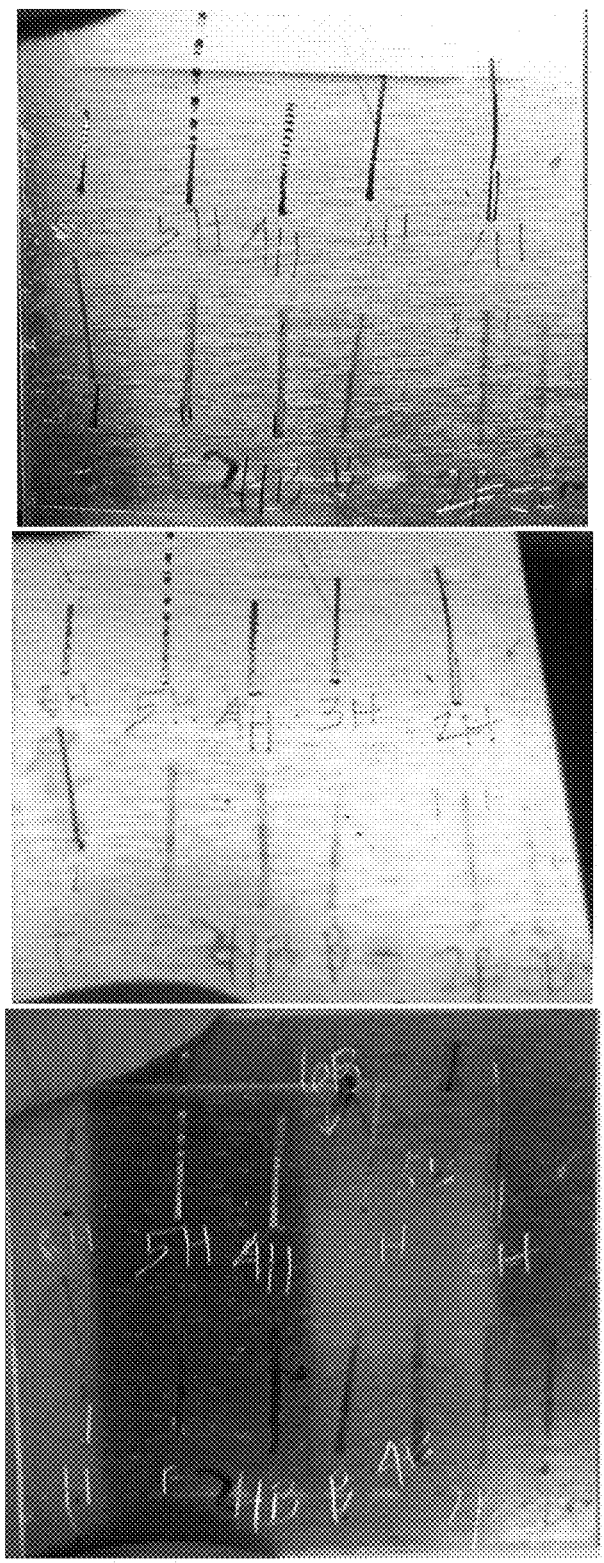
FIG. 19 shows full display straight on image view of pencil hardness indentations from 6H to 3B (top), hardness spectrum tilted upward (middle), and entire hardness spectrum (bottom) of aluminum oxide coated substrates. The coating has a thickness of 400 nm.

FIG. 19 (top) shows a full display of straight on image view of pencil hardness indentations from 6H to 3B. Faded scratches past HB and gouge hardness at F was noted.

FIG. 19 (middle) shows a hardness spectrum tilted upward to show pink scratches that do not scratch through coating to 3B.

FIG. 19 (bottom) shows the entire hardness spectrum (unorganized)-low lighting.

At 2H, the scratch was not as intrusive as preceding indentations, however it still scratched through the coating surface. Beginning at pencil hardness F, there was a complete change in scratch/indentation result-pink scratch that did not go all the way through coating. At 2B, the scratch faded with rubbing, but can be seen in different light reflection (tilt sample).
Sample GA5

Figure 20:
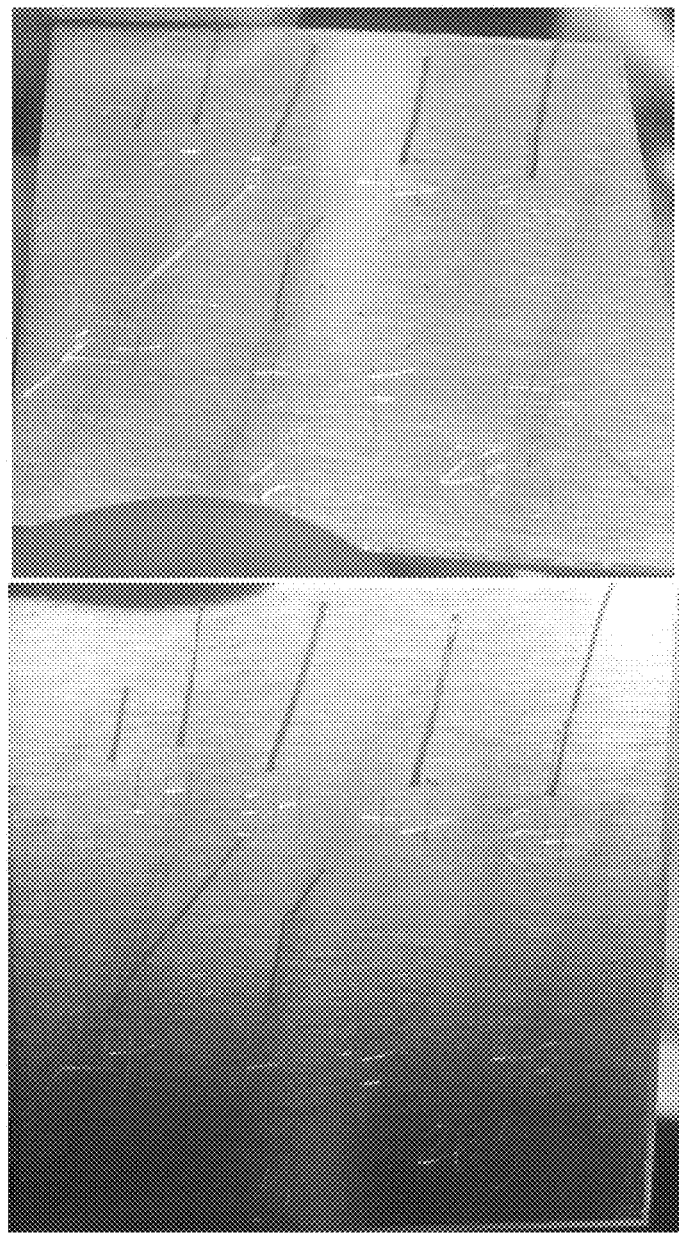
FIG. 20 shows full display images demonstrating the pencil hardness indentations from 6H to 2B (top) and straight on image view of pencil hardness indentation (bottom) of aluminum oxide coated substrates. The coating has a thickness of 600 nm.

FIG. 20 (top) shows an angled full display of pencil hardness indentations from 6H-2B. An indentation visibility disappears around hardness F.

FIG. 20 (bottom) shows a straight on view with full display of pencil hardness indentation considering differing reflection.

It was noted that at about 3H, the scratch became less intrusive and skinnier; the indentation was not full. At 2H, indentation became very skinny. At F, there was a super small evidence of indentation (still deforms coating). At HB, the scratch was blue and not metallic (showing does not penetrate coating) and most of scratch can be rubbed away.
Sample GA5

Figure 21:
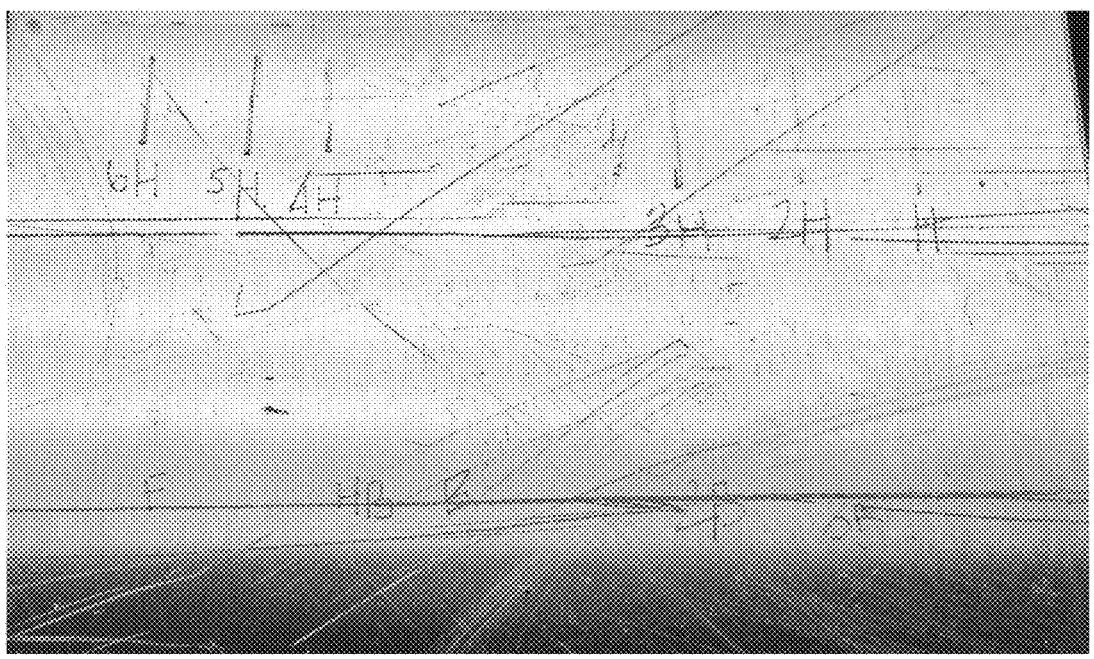
FIG. 21 is an image showing pencil hardness spectrum from 6H to 3B of aluminum oxide coated substrates. The coating has a thickness of 1000 nm.

FIG. 21 shows a pencil hardness spectrum 6H to 3B for GA6. A gouge hardness was noticed beginning at 4H.

It was noted that 6H hardness completely carved through the pink coating of the sample. 5H testing showed a variant resistant to push (speedy to slippery) and the scratch became skinny half way through experimenting. 4H immediately experienced a lesser resistance to flow and part of the indentation was pink and therefore did not penetrate through coating-gouge hardness. With 2H, there was little to no resistance to pushing during experimentation and can rub most of scratch off. At HB and more, the scratch can be completely rubbed off, and experimentation stopped here.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A method of imparting color to a metal substrate, the method comprising:
    depositing an electrically conductive colored coating onto a surface of the metal substrate to a thickness from about 10 nm to about 90 nm, wherein the electrically conductive colored coating reflects light within a wavelength range from 400 nm to 700 nm, wherein the electrically conductive colored coating comprises titanium nitride, and
    controlling a color of the metal substrate by controlling the thickness of the coating, wherein the metal substrate comprises nickel, stainless steel, aluminum, or combinations thereof, and the metal substrate exhibits a change in color with increasing thickness of the electrically conductive colored coating, that is independent of component(s) in the coating,
    wherein depositing the electrically conductive colored coating is by radio frequency sputtering at a vacuum pressure of from about 5 mTorr to about 25 mTorr, with a power from about 200 W to about 500 W, and using an inert gas having a flow rate of from about 5 standard cubic centimeters per minute (sccm) to about 15 sccm as a sputtering gas at a sputtering temperature of from about 25° C. to about 40° C., for about 0.1 min to about 10 mins, and wherein the metal substrate has a temperature of up to 350° C.,
    wherein about means within 5%.

2. The method of claim 1, wherein the metal substrate is a battery terminal, an architectural component, or an aerospace structural component.

3. The method of claim 2, wherein the metal substrate is a battery terminal on a coin cell battery.

4. The method of claim 1, wherein the radio frequency sputtering is conducted at a vacuum pressure of from about 5 mTorr to about 10 mTorr, with a power from about 200 W to about 300 W, and using an inert gas having a flow rate of from about 10 sccm to about 15 sccm as the sputtering gas at a sputtering temperature of from about 25° C. to about 40° C., for about 0.1 min to about 10 mins.

5. The method of claim 1, wherein the electrically conductive colored coating further comprises an alloying element selected from at least one of aluminum, cobalt, manganese, vanadium, chromium, niobium, nickel, molybdenum, or copper.

6. The method of claim 5, wherein titanium nitride and the alloying element are present in a weight ratio of from 1:1 to 99:1.

7. The method of claim 5, wherein the alloying element includes aluminum.

8. The method of claim 7, wherein titanium nitride and aluminum are present in a weight ratio of from 2:1 to 25:1.

9. The method of claim 1, further comprising positioning a mask having a predetermined pattern to conceal at least a portion of the metal substrate prior to depositing the electrically conductive colored coating and removing the mask after depositing the electrically conductive colored coating.

10. The method of claim 1, wherein the electrically conductive colored coating has a thickness from about 30 nm to about 80 nm.

11. The method of claim 1, wherein the metal substrate exhibits a change in color from pale gold to red with increasing thickness of the electrically conductive colored coating.

12. The method of claim 1, wherein the metal substrate has a temperature of up to 300° C.

13. A method of imparting color to a metal substrate, the method comprising:
    depositing an electrically conductive colored coating onto a surface of the metal substrate to a thickness from about 10 nm to about 90 nm, wherein the metal substrate exhibits a change in color from pale gold to red with increasing thickness of the electrically conductive colored coating,
    controlling a coarse color of the metal substrate by controlling the thickness of the coating and controlling a fine color of the metal substrate by controlling a weight ratio of titanium nitride and an alloying element,
    wherein depositing the electrically conductive colored coating is by radio frequency sputtering at a vacuum pressure of from about 5 mTorr to about 25 mTorr, with a power from about 200 W to about 500 W, and using an inert gas having a flow rate of from about 5 standard cubic centimeters per minute (sccm) to about 15 sccm as a sputtering gas at a sputtering temperature of from about 25° C. to about 40° C., for about 0.1 min to about 10 mins,
    wherein the metal substrate comprises nickel, stainless steel, aluminum, or combinations thereof,
    wherein about means within 5%.

14. The method of claim 13, wherein the alloying element includes aluminum.

15. The method of claim 13, wherein titanium nitride and aluminum are present in a weight ratio of from 2:1 to 25:1.

16. The method of claim 13, wherein the metal substrate is a battery terminal, an architectural component, or an aerospace structural component.

17. The method of claim 16, wherein the metal substrate is a battery terminal on a coin cell battery.

18. The method of claim 1, wherein the electrically conductive colored coating has a sheet resistance of $7.0 \times 10^{-4}$ ohm/sq, or less.

19. The method of claim 1, wherein the electrically conductive colored coating consists essentially of titanium nitride.

20. The method of claim 5, wherein the titanium nitride is present as a first layer having a first thickness and the alloying element is present as a second layer having a second thickness, such that the thickness of the electrically conductive coating is the sum of the first thickness and the second thickness, and wherein the second thickness is from 1 nm to 50 nm.

21. The method of claim 13, wherein the titanium nitride is present as a first layer having a first thickness and the alloying element is present as a second layer having a second thickness, such that the thickness of the electrically conductive coating is the sum of the first thickness and the second thickness, and wherein the second thickness is from 1 nm to 50 nm.

22. The method of claim 13, wherein the electrically conductive colored coating has a thickness from about 30 nm to about 80 nm.

23. The method of claim 1, wherein the metal substrate exhibits a change in color from golds to blues and greens with increasing thickness of the electrically conductive colored coating.

24. The method if claim 13, wherein the metal substrate exhibits a change in color from golds to blues and greens with increasing thickness of the electrically conductive colored coating.

* * * * *

UNITED STATES PATENT AND TRADEMARK OFFICE
CERTIFICATE OF CORRECTION

| | | |
|---|---|---|
| PATENT NO. | : 12,227,827 B2 | Page 1 of 1 |
| APPLICATION NO. | : 16/204625 | |
| DATED | : February 18, 2025 | |
| INVENTOR(S) | : William Judson Ready et al. | |

It is certified that error appears in the above-identified patent and that said Letters Patent is hereby corrected as shown below:

On the Title Page

Column 2, under "other publications", Line 1: delete "AI" and insert -- Al --

Column 2, under "other publications", Line 3: delete "TiAIN" and insert -- TiAlN --

In the Claims

Column 24, Line 18, in Claim 18 at Line 2: delete "ohm/sq," and insert -- ohm/sq. --

Column 24, Line 43, in Claim 24 at Line 1: delete "if" and insert -- of --

Signed and Sealed this
Twenty-sixth Day of August, 2025

Coke Morgan Stewart
*Acting Director of the United States Patent and Trademark Office*